US007223321B1

(12) United States Patent
Comendant et al.

(10) Patent No.: US 7,223,321 B1
(45) Date of Patent: May 29, 2007

(54) FARADAY SHIELD DISPOSED WITHIN AN INDUCTIVELY COUPLED PLASMA ETCHING APPARATUS

(75) Inventors: Keith Comendant, Fremont, CA (US); Robert J. Steger, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 187 days.

(21) Appl. No.: 10/232,564

(22) Filed: Aug. 30, 2002

(51) Int. Cl.
*C23C 16/00* (2006.01)
*H01L 21/306* (2006.01)
(52) U.S. Cl. .............................. 156/345.48; 118/723 I; 118/723 AN
(58) Field of Classification Search .............. 118/723 I, 118/723 IR, 723 AN; 156/345.48, 345.49; 315/111.51
See application file for complete search history.

(56) References Cited

U.S. PATENT DOCUMENTS

| 6,280,563 | B1 * | 8/2001 | Baldwin et al. ....... 156/345.48 |
| 6,503,364 | B1 * | 1/2003 | Masuda et al. ........ 156/345.24 |
| 6,666,982 | B2 * | 12/2003 | Brcka ........................... 216/68 |

\* cited by examiner

*Primary Examiner*—Luz Alejandro-Mulero
(74) *Attorney, Agent, or Firm*—Martine Penilla & Gencarella, LLP

(57) ABSTRACT

An apparatus and method is provided for positioning and utilizing a Faraday shield in direct exposure to a plasma within an inductively coupled plasma etching apparatus. Broadly speaking, the Faraday shield configuration maintains a condition of an etching chamber window. At a minimum, positioning the Faraday shield between the window and the plasma prevents erosion of the window resulting from plasma sputter and shunts heat generated by an etching process away from the window.

28 Claims, 21 Drawing Sheets

FARADAY SHIELD DISPOSED WITHIN AN INDUCTIVELY COUPLED PLASMA ETCHING APPARATUS

BACKGROUND OF THE INVENTION

1. Field of the Invention

The present invention relates generally to semiconductor fabrication, and more particularly, to apparatuses and methods for using a Faraday shield in direct exposure to a plasma within an inductively coupled plasma etching apparatus.

2. Description of the Related Art

In semiconductor manufacturing, etching processes are commonly and repeatedly carried out. As is well known to those skilled in the art, there are two types of etching processes: wet etching and dry etching. Dry etching is typically performed using an inductively coupled plasma etching apparatus.

FIG. 1A shows an inductively coupled plasma etching apparatus 100, in accordance with the prior art. The inductively coupled plasma etching apparatus 100 includes an etching chamber structurally defined by chamber walls 101 and a window 111. The chamber walls 101 are typically fabricated from stainless steel or aluminum. The window 111 is typically fabricated from quartz. The chamber walls 101 and the window 111 are configured to form a chamber internal cavity 102.

A chuck 117 is positioned within the chamber internal cavity 102 near the bottom inner surface of the etching chamber. The chuck 117 is configured to receive and hold a semiconductor wafer (i.e., "wafer") 119 upon which the etching process is performed. The chuck 117 can be electrically charged using an RF power supply 123. The RF power supply 123 is connected to matching circuitry 121 through a connection 127. The matching circuitry 121 is connected to the chuck 117 through a connection 125. In this manner, the RF power supply 123 is connected to the chuck 117.

A coil 133 is positioned above the window 111. The coil 133 is fabricated from an electrically conductive material and includes at least one complete turn. The exemplary coil 133 shown in FIG. 1A includes three turns. The coil 133 symbols having an "X" indicate that the coil 133 extends rotationally into the page. Conversely, the coil 133 symbols having a "•" indicate that the coil 133 extends rotationally out of the page. An RF power supply 141 is configured to supply RF power to the coil 133. In general, the RF power supply 141 is connected to matching circuitry 139 through a connection 145. The matching circuitry 139 is connected to the coil 133 through a connection 143. In this manner, the RF power supply 141 is connected to the coil 133. A Faraday shield 149 is positioned between the coil 133 and the window 111. The Faraday shield 149 is maintained in a spaced apart relationship relative to the coil 133. The Faraday shield 149 is disposed immediately above the window 111. The coil 133, the Faraday shield 149, and the window 111 are each configured to be substantially parallel to one another.

FIG. 1B shows the basic operating principles of the inductively coupled plasma etching apparatus 100, in accordance with the prior art. During operation, a reactant gas flows through the chamber internal cavity 102 from a gas lead-in port (not shown) to a gas exhaust port (not shown). High frequency power is then applied from the RF power supply 141 to the coil 133 to cause an RF current to flow through the coil 133. The RF current flowing through the coil 133 generates an electromagnetic field 151 about the coil 133. The electromagnetic field 151 generates an inductive current 153 within the chamber internal cavity 102. The inductive current 153 acts on the reactant gas to generate a plasma 155. High frequency power is applied from the RF power supply 123 to the chuck 117 to provide directionality to the plasma 155 such that the plasma 155 is "pulled" down onto the wafer 119 surface to effect the etching process. An electrostatic field is also generated between the coil 133 and the plasma 155. This field is not necessarily uniform. High voltage gradients can drive the plasma 155 into the window 111 with sufficient energy to erode the window 111, and cause large temperature gradients within the window 111. The Faraday shield 149 ensures the electrostatic field is more uniformly distributed across the window 111, thus lessening the effects of temperature and erosion.

The plasma 155 contains various types of radicals in the form of positive and negative ions. The chemical reactions of the various types of positive and negative ions are used to etch the wafer 119. During the etching process, the coil 133 performs a function analogous to that of a primary coil in a transformer, while the plasma 155 performs a function analogous to that of a secondary coil in the transformer.

The reaction products generated by the etching process may be volatile or non-volatile. The volatile reaction products are discarded along with used reactant gas through the gas exhaust port. The non-volatile reaction products, however, typically remain in the etching chamber. The non-volatile reaction products may adhere to the chamber walls 101 and the window 111.

FIG. 1C shows an illustration of a deposition 157 of non-volatile reaction products on the window 111 in accordance with the prior art. Adherence of non-volatile reaction products to the window 111 may interfere with the etching process. Excessive deposition 157 may result in particles flaking off the window 111 onto the wafer 119, thus interfering with the etching process. Excessive deposition 157, therefore, requires more frequent cleaning of the chamber walls 101 and the window 111 which adversely affects wafer 119 throughput.

In contrast to the deposition 157 of non-volatile reaction products on the window 111, plasma 155 sputter can cause erosion of the window 111. FIG. 1D shows an illustration of window 111 erosion 159 in accordance with the prior art. Such erosion 159 not only shortens the useful lifetime of the window 111, but also generates particles which can contaminate the wafer 119 and introduce unwanted chemical species into the chamber internal cavity 102. The presence of unwanted species in the chamber internal cavity 102 is particularly undesirable because it leads to poor reproducibility of the etching process conditions and resulting wafer 119 characteristics.

In addition to the deposition 157 and erosion 159 problems associated with the window 111, selection of the window 111 material is limited by the thermal output of the etching process. During the etching process, the window 111 is exposed directly to the plasma 155. Therefore, the window 111 must absorb not only the heat generated by the bulk plasma 155 but also the heat transferred to the window 111 from sputtered plasma 155. The thermal properties of the window 111 must be sufficient to accommodate the thermal energy absorbed by the window 111 during the etching process. The thermal properties of the window 111 are primarily defined by the window 111 material.

Quartz is commonly used as a window 111 material in the inductively coupled plasma etching apparatus 100. The primary benefit associated with quartz is its low coefficient of thermal expansion. Thus, in the presence of a high temperature gradient from its center to its edge, the quartz window 111 will not experience differential thermal expansion leading to cracking and failure. Quartz, however, has a relatively low tensile strength. Thus, a large (e.g., $\geq 1.75$ inch) quartz window 111 thickness is typically required to span the opening above the chamber internal cavity 102. The quartz window 111 is relatively expensive and costly to replace upon failure. Thus, it is desirable to have more flexibility in using window 111 materials other than quartz.

Ceramic has been used as an alternative to quartz for the window 111 material. Ceramic is more durable, stronger, and less expensive that quartz. However, ceramic materials have a higher coefficient of thermal expansion than quartz. Thus, when exposed to a high thermal output associated with certain etching processes, the ceramic window 111 is more susceptible to experiencing differential thermal expansion leading to cracking and failure. For ceramic window 111 materials to be used in higher thermal output etching processes, it is necessary to maintain a low temperature gradient across the ceramic window 111 to prevent cracking and failure.

In view of the foregoing, there is a need for an apparatus and a method to protect the window from deposition of non-volatile reaction products, erosion due to plasma sputter, and high temperatures resulting from the heat source associated with the etching process.

SUMMARY OF THE INVENTION

Broadly speaking, the present invention fills these needs by providing an apparatus and method to maintain a condition of an etching chamber window by configuring a Faraday shield between the etching chamber window and a plasma. It should be appreciated that the present invention can be implemented in numerous ways, including as a process, an apparatus, a system, a device, or a method. Several embodiments of the present invention are described below.

In one embodiment, an apparatus for plasma processing is disclosed. The apparatus includes a chamber having a substrate support, surrounding walls, and an upper surface to define a plasma containment region. A metal shield is disposed within the chamber. The metal shield is oriented over the substrate support and proximate to the upper surface of the chamber. The metal shield is located substantially above the plasma containment region of the chamber. The metal shield is capable of being in direct contact with a plasma to be generated in the plasma containment region.

In another embodiment, a plasma etching apparatus is disclosed. The plasma etching apparatus includes a chamber having an interior cavity defined by a bottom and side walls. The side walls are configured to have a top surface. A plate is configured to interface with the top surface of the side walls. The plate has an upper surface and a lower surface. The plate is further configured to have an opening centrally located above the interior cavity. A window is configured to interface with the upper surface of the plate. The window covers the opening centrally located above the interior cavity. A metal shield is disposed immediately below the window and inside the chamber. The metal plate is capable of being exposed directly to a plasma to be generated in the interior cavity.

In another embodiment, a method for making an inductively coupled plasma etching apparatus is disclosed. The method includes providing a chamber having an interior cavity defined by a bottom, a top, and side walls. The top is configured to have an opening. The method further includes placing a metal shield over the chamber interior cavity such that the metal shield is directly exposed to the chamber interior cavity. The method also includes placing a window above the metal shield such that the window creates a seal around the top opening of the chamber. The metal shield remains inside the chamber interior cavity and below the window. The method further includes placing a coil above the window.

The advantages of the present invention are numerous. Most notably, the apparatus and method for configuring a Faraday shield between the etching chamber window and a plasma avoids the problems of the prior art by maintaining the condition of the etching chamber window. The present invention avoids one problem of the prior art by preventing erosion of the etching chamber window resulting from plasma sputter. The present invention avoids another problem of the prior art by shunting heat generated by an etching process away from the etching chamber window.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

Figure 7:
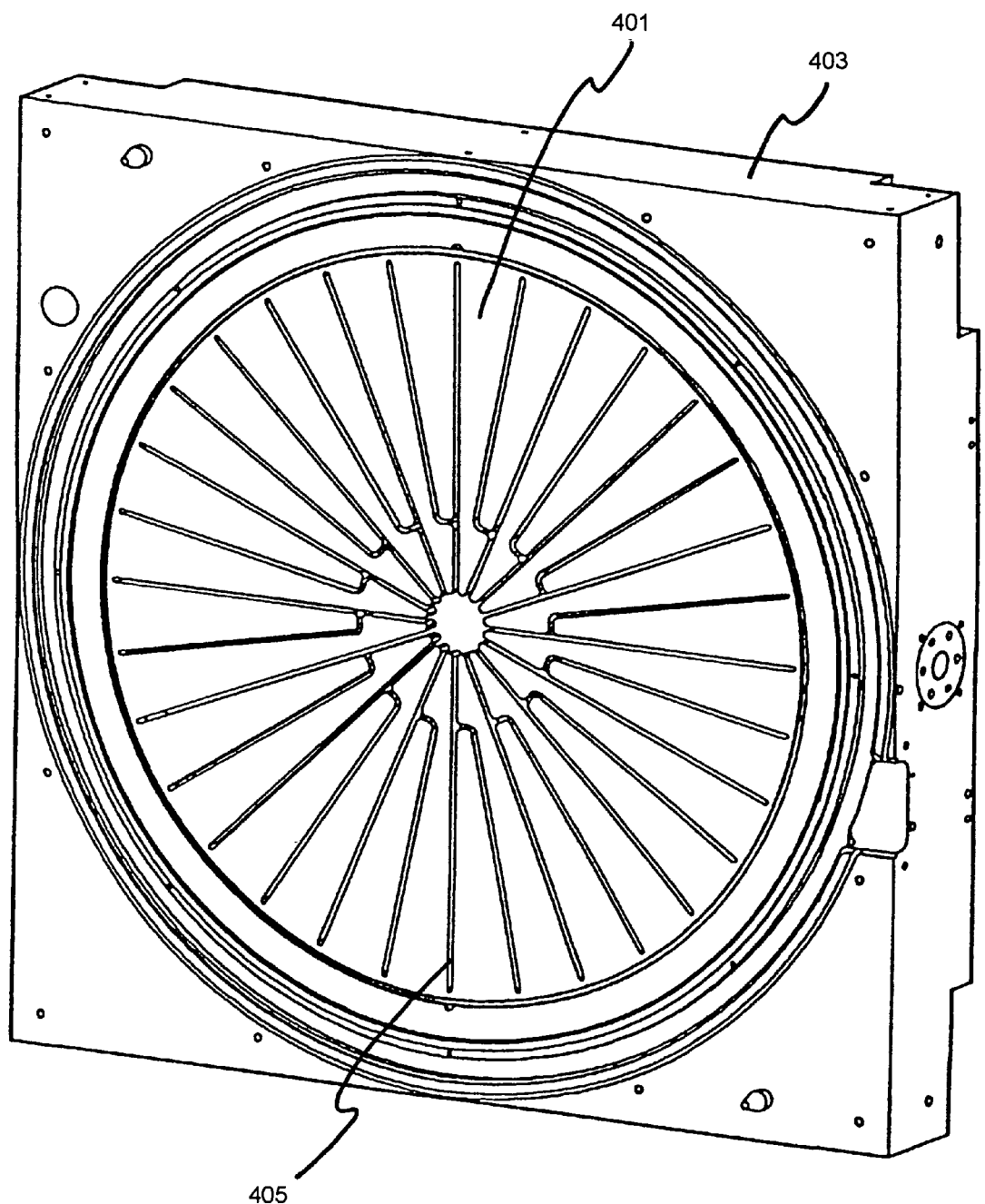
Figure 8:
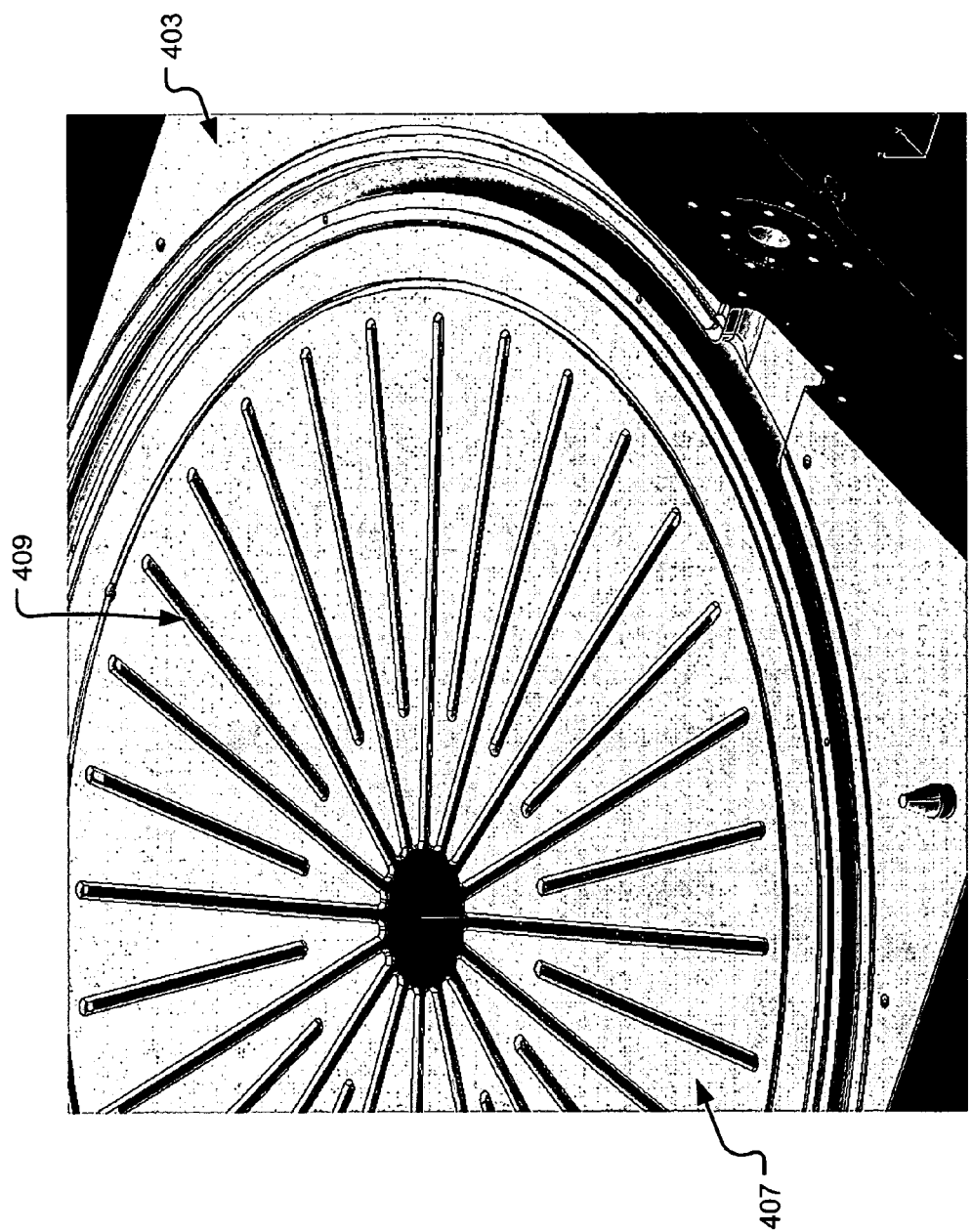
Figure 9:
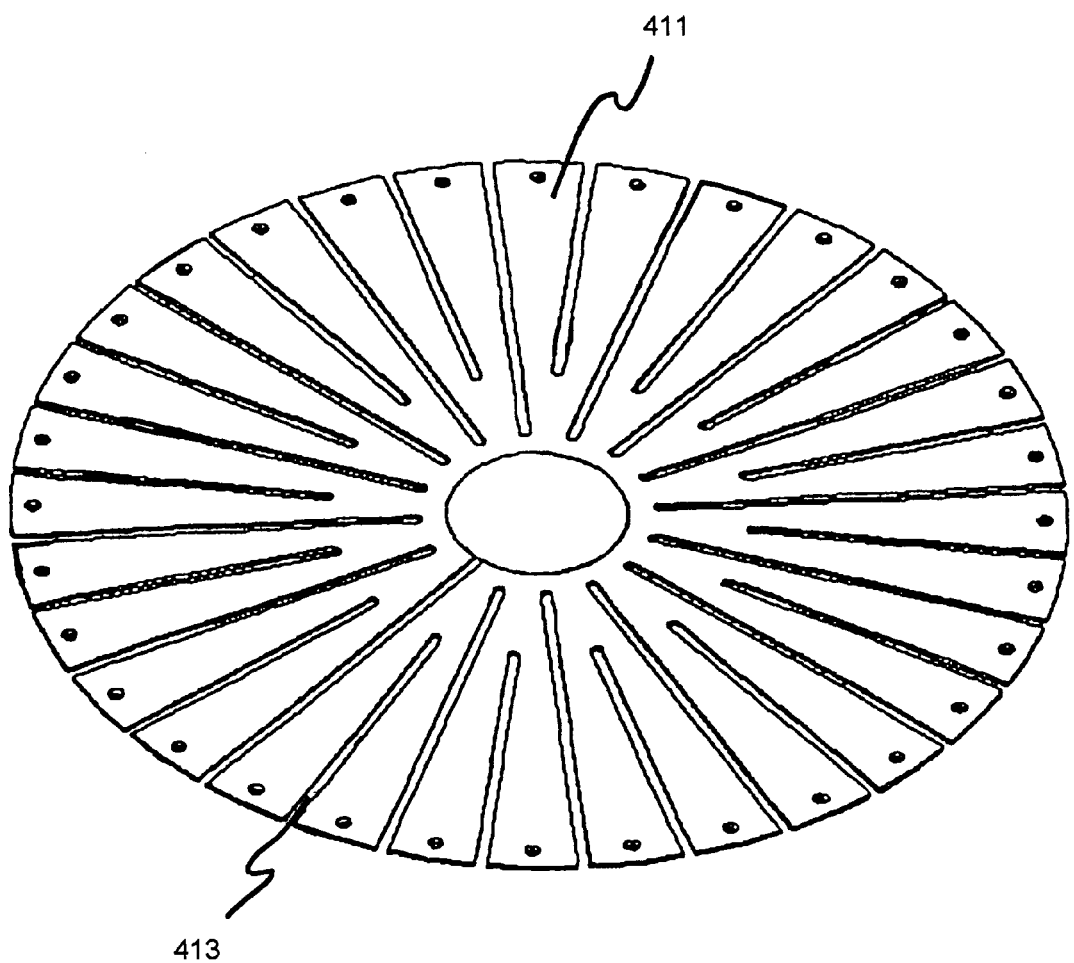
Figure 10:
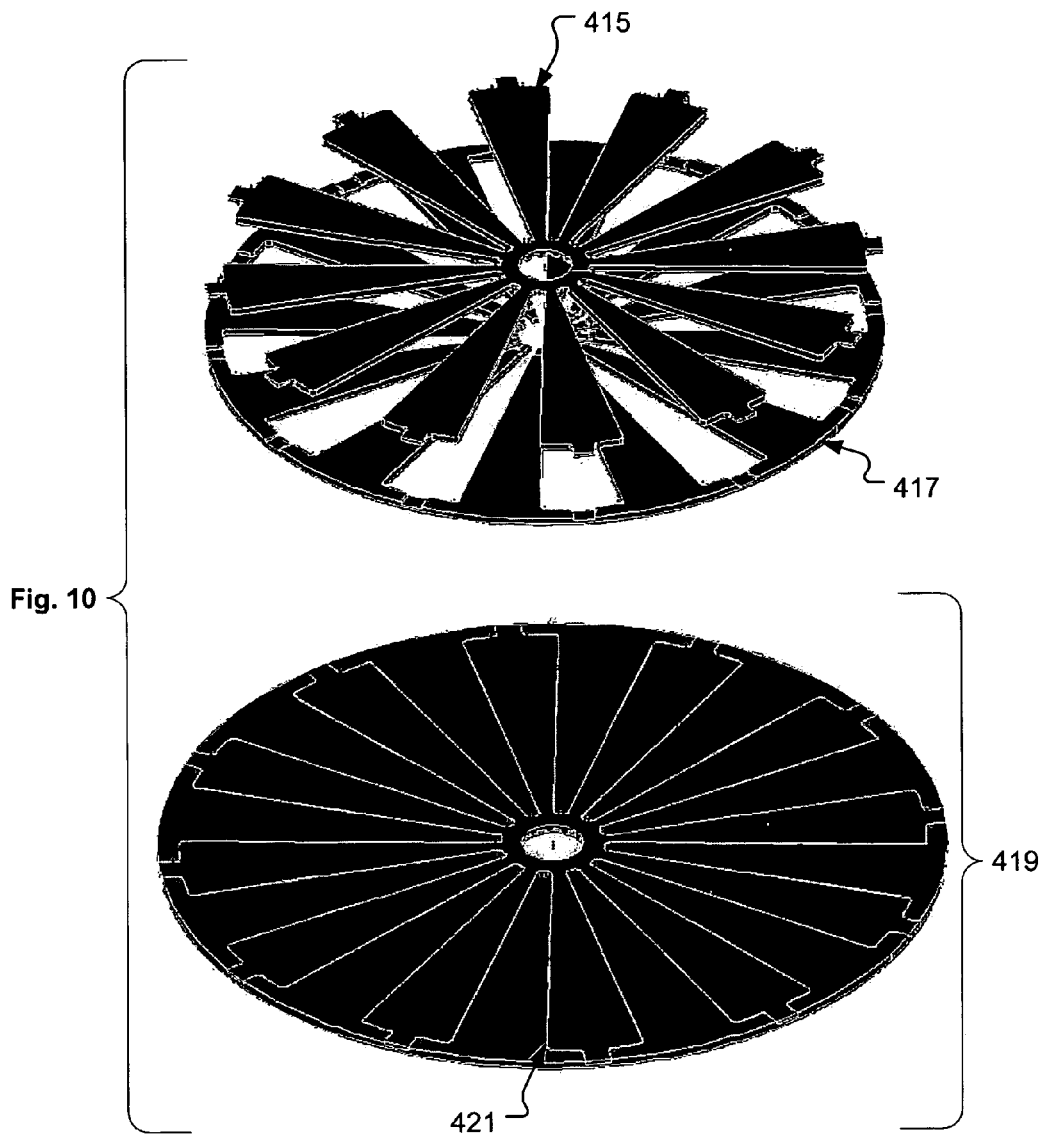
Figure 11:
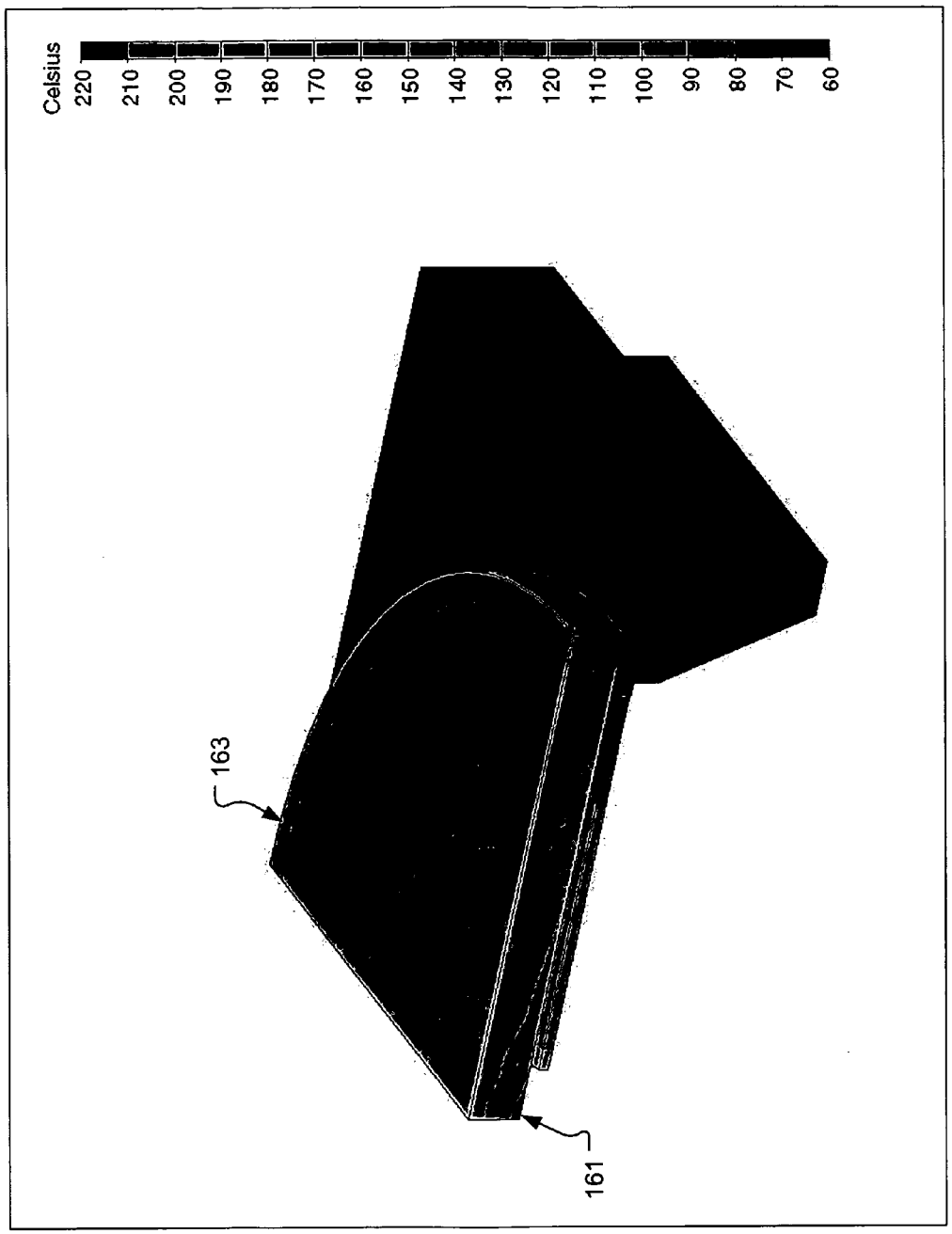
Figure 12:
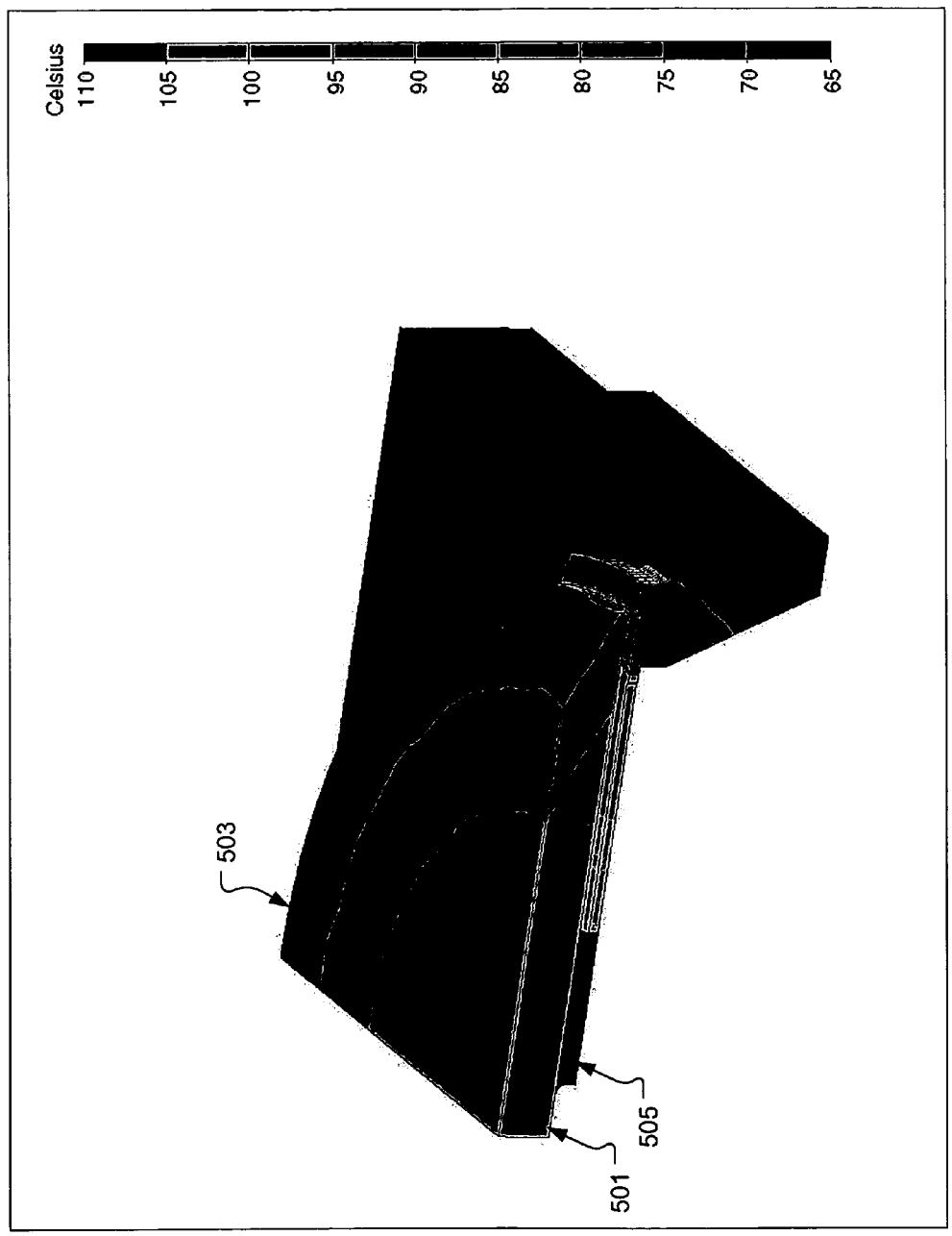
Figure 13:
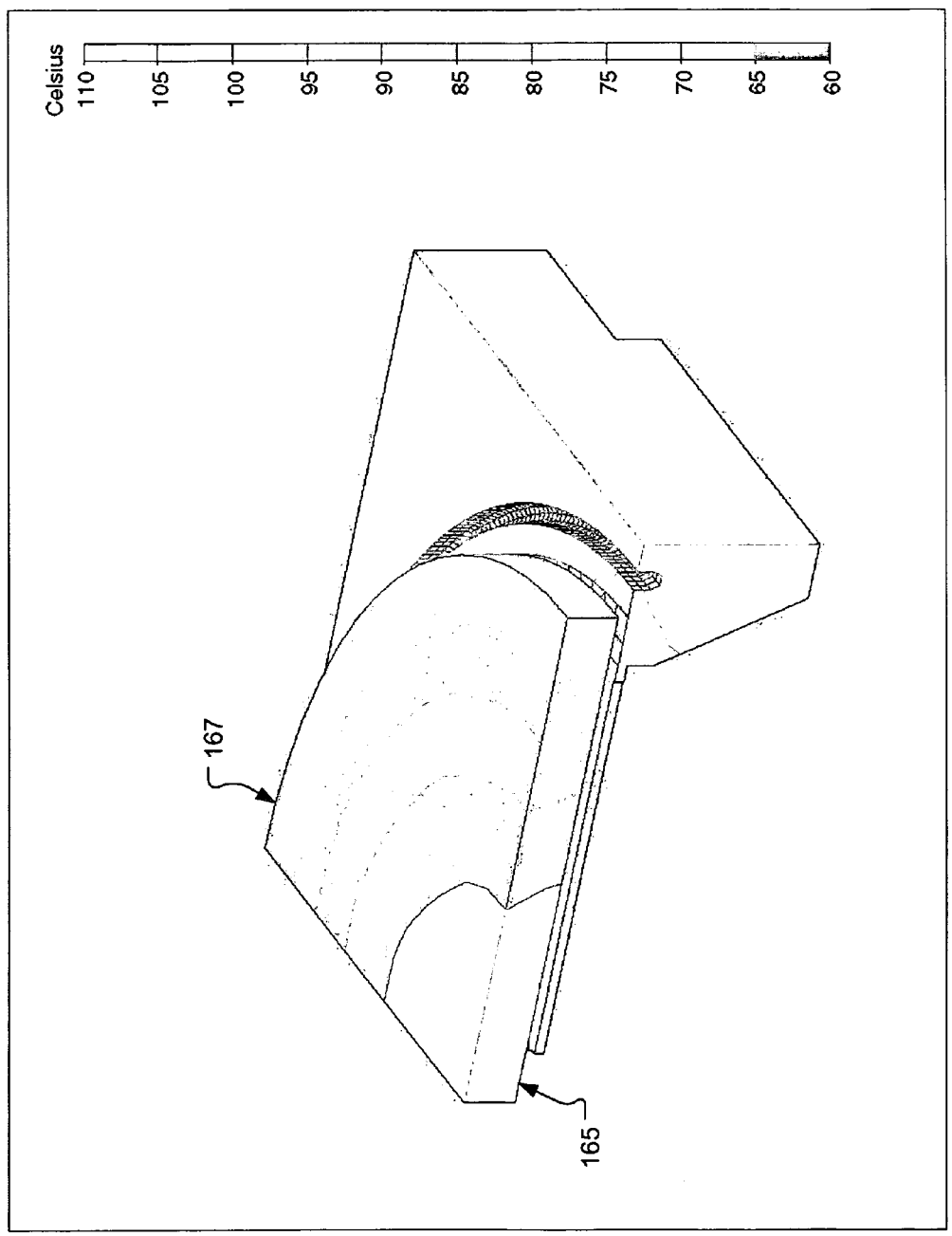
Figure 14:
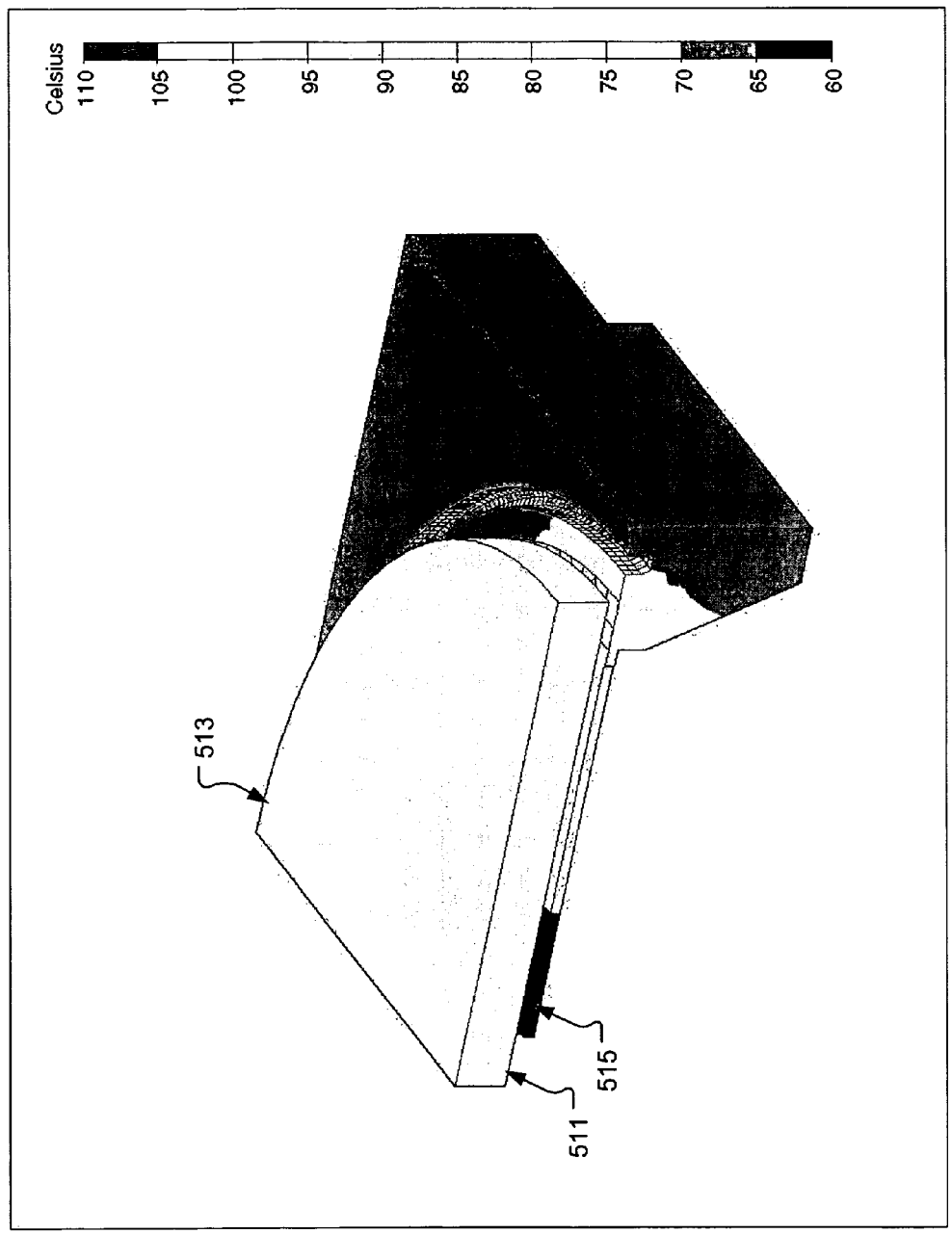
Figure 15:
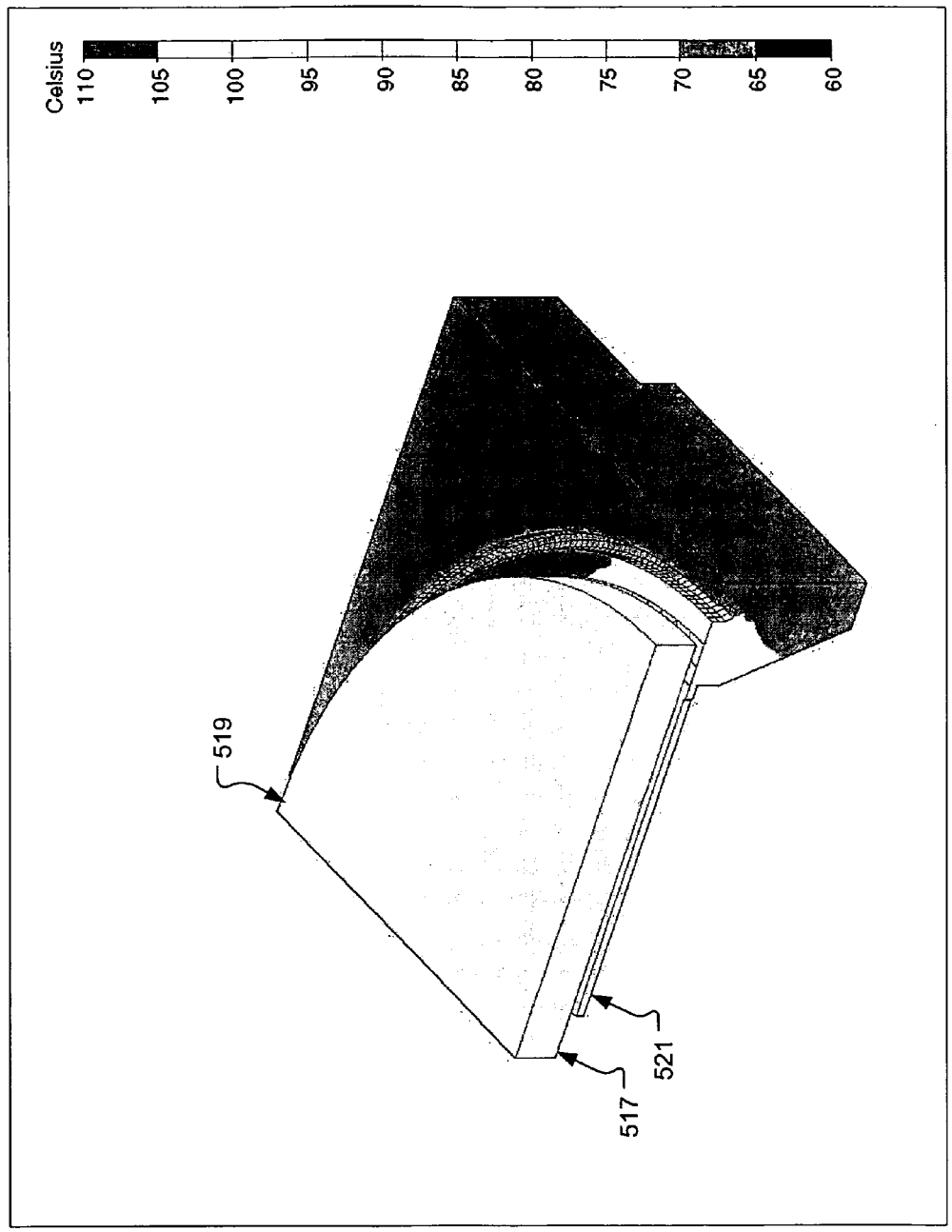
Figure 16:
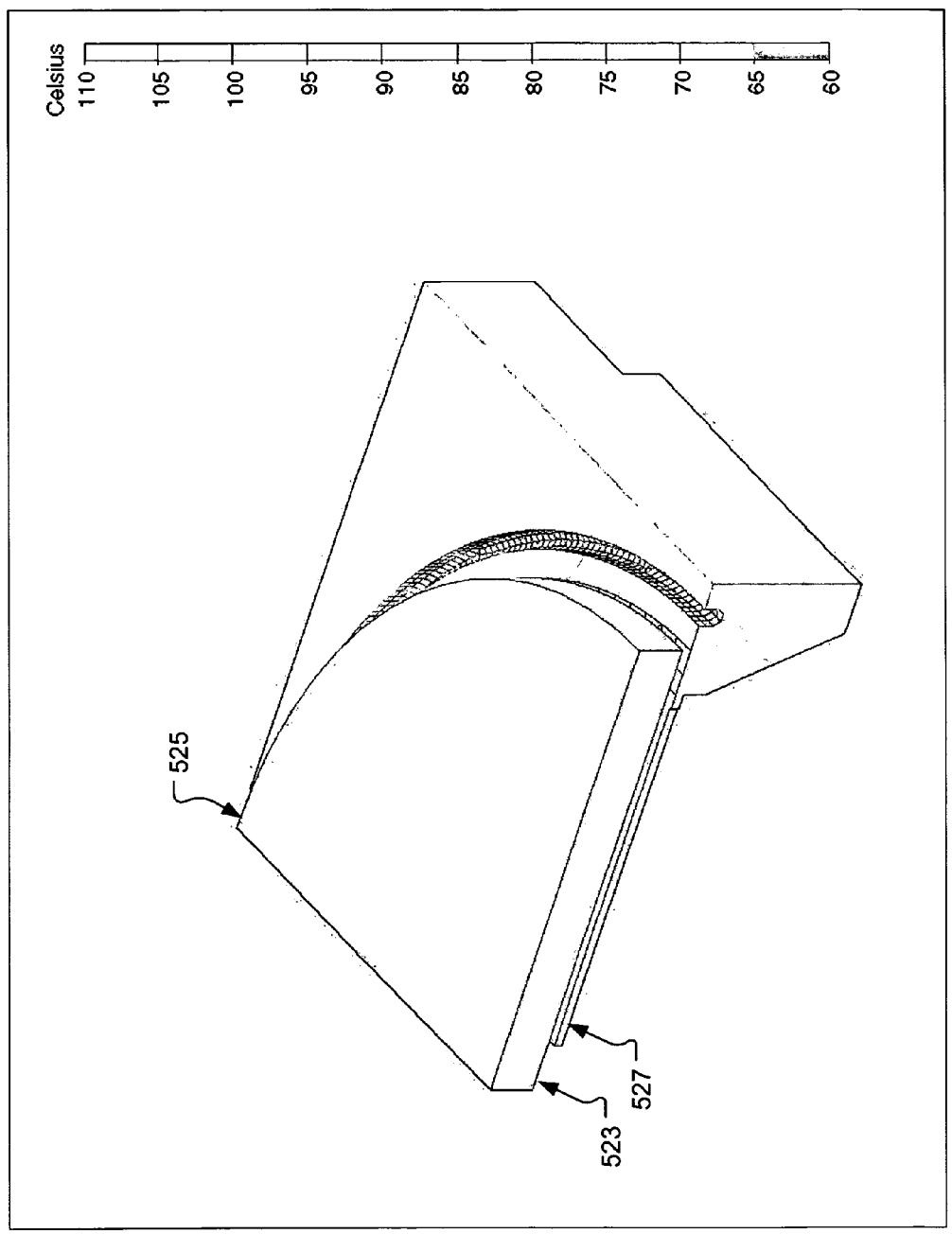
Figure 17:
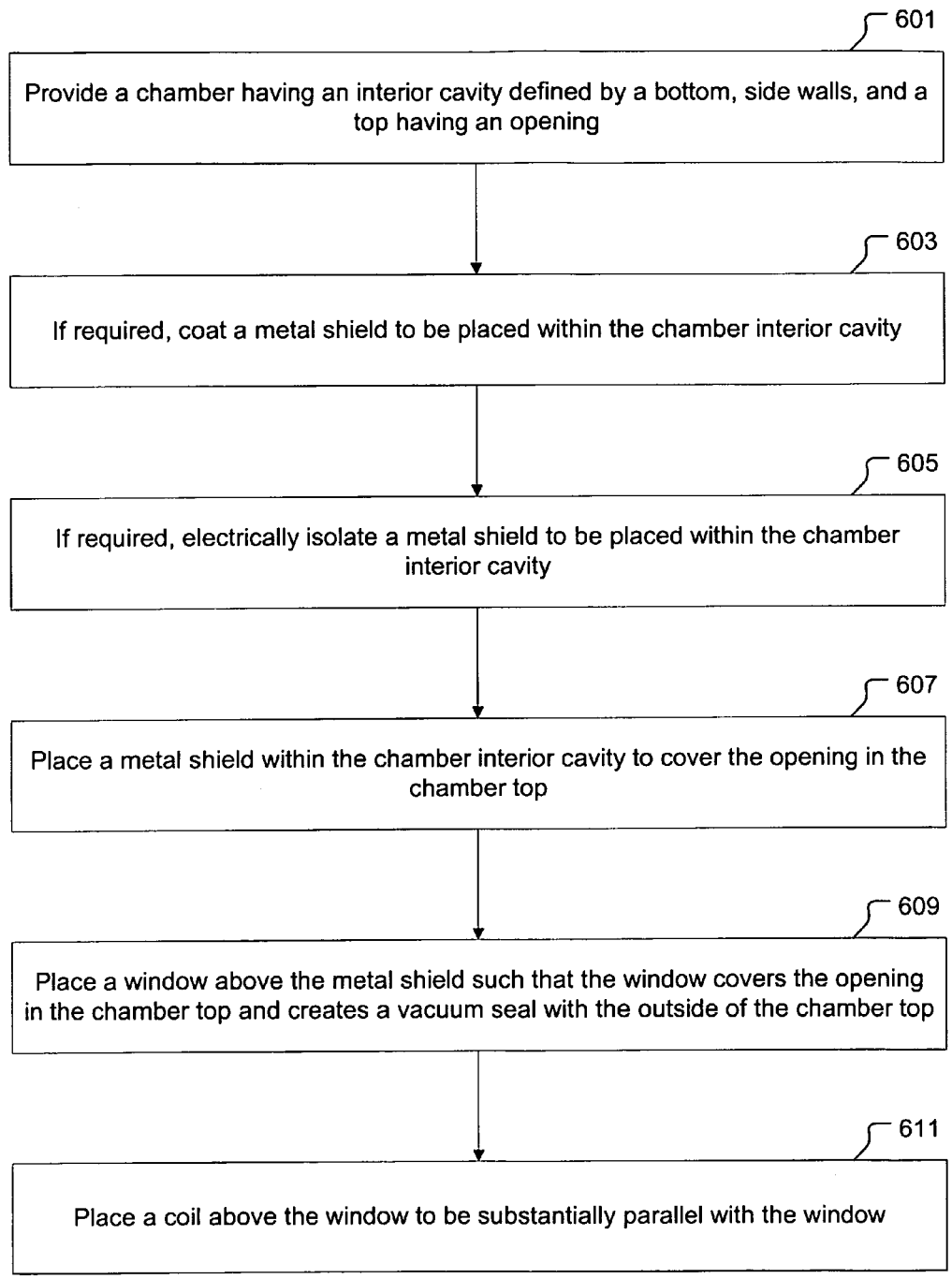

FIG. 7 shows an illustration of a top view of a Faraday shield 401 configured within an adapter plate 403 in accordance with an exemplary embodiment of the present invention;

FIG. 8 shows an illustration of a top view of a Faraday shield 407 configured within an adapter plate 403 in accordance with an exemplary embodiment of the present invention;

FIG. 9 shows an illustration of a Faraday shield 411 in accordance with an exemplary embodiment of the present invention;

FIG. 10 shows an illustration of a two-part Faraday shield assembly 419 in accordance with an exemplary embodiment of the present invention;

FIG. 11 shows an illustration of an exemplary temperature distribution across a quartz window directly exposed to the plasma in accordance with the prior art;

FIG. 12 shows an illustration of an exemplary temperature distribution across the quartz window when the Faraday shield is disposed substantially near the window inside the inductively coupled plasma etching chamber in accordance with one embodiment of the present invention;

FIG. 13 shows an illustration of an exemplary temperature distribution across a ceramic (e.g., $Al_2O_3$) window directly exposed to the plasma in accordance with the prior art;

FIG. 14 shows an illustration of an exemplary temperature distribution across the ceramic window when a 0.19 inch thick Faraday shield is disposed substantially near the window inside the inductively coupled plasma etching chamber in accordance with one embodiment of the present invention;

FIG. 15 shows an illustration of an exemplary temperature distribution across the ceramic window when a 0.38 inch thick Faraday shield is disposed substantially near the window inside the inductively coupled plasma etching chamber in accordance with one embodiment of the present invention;

FIG. 16 shows an illustration of an exemplary temperature distribution across the ceramic window when a 0.56 inch thick Faraday shield is disposed substantially near the window inside the inductively coupled plasma etching chamber in accordance with one embodiment of the present invention; and FIG. 17 shows a flowchart of a method for making an inductively coupled plasma etching apparatus in accordance with one embodiment of the present invention.

DETAILED DESCRIPTION OF THE PREFERRED EMBODIMENTS

An invention is disclosed for apparatuses and methods for positioning and using a Faraday shield in direct exposure to a plasma within an inductively coupled plasma etching apparatus. Broadly speaking, the present invention maintains a condition of an etching chamber window. Configuring the Faraday shield between the window and the plasma prevents erosion of the window resulting from plasma sputter and shunts heat generated by an etching process away from the window. The present invention solves one problem of the prior art by reducing the window replacement frequency driven by erosion of the window due to plasma sputter. The present invention solves another problem of the prior art by allowing the use of a larger variety of window materials through a relaxation of thermal performance requirements afforded by the shunting of heat away from the window.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
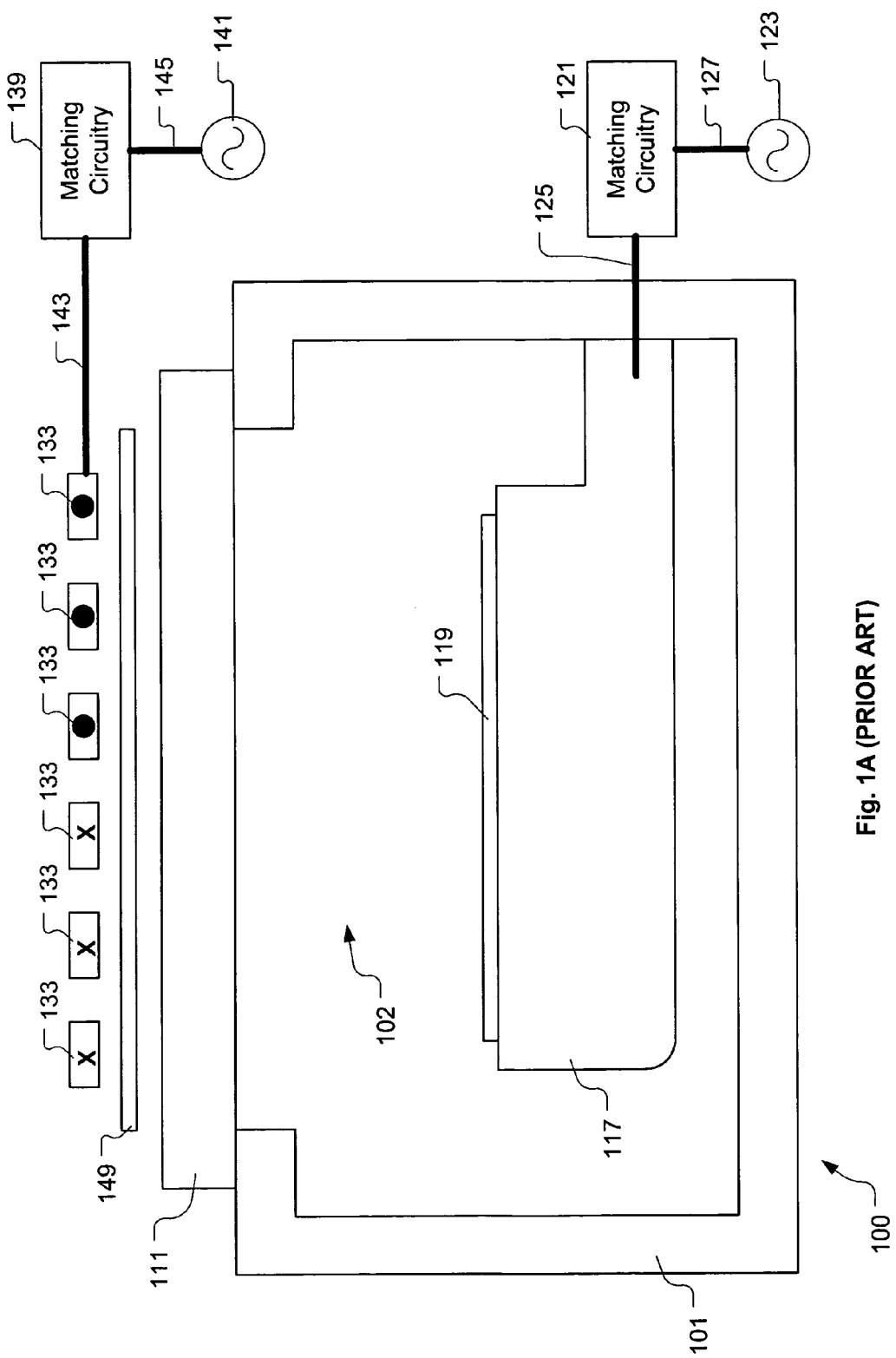
FIG. 1A shows an inductively coupled plasma etching apparatus 100, in accordance with the prior art.
Figure 1B:
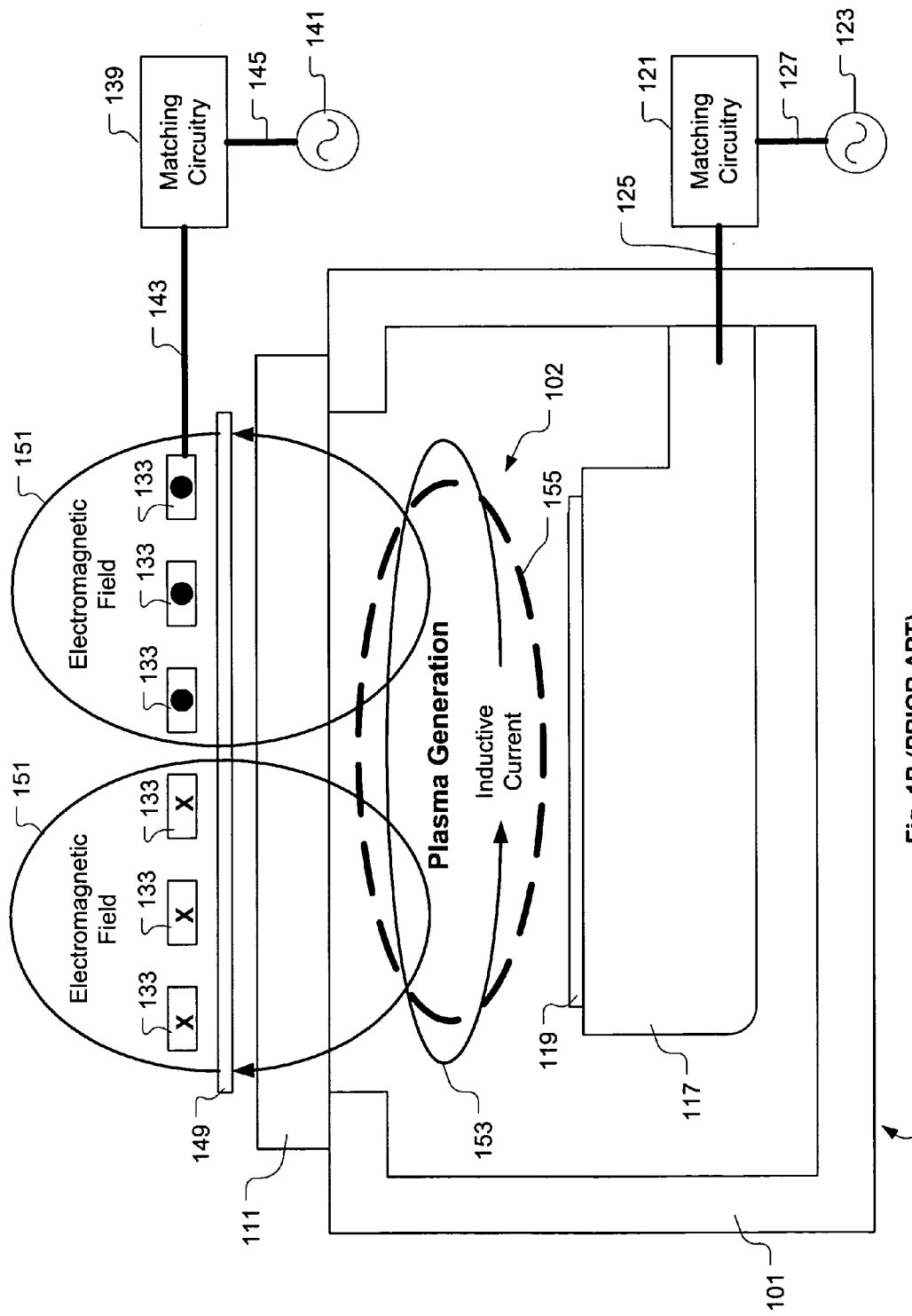
FIG. 1B shows the basic operating principles of the inductively coupled plasma etching apparatus 100, in accordance with the prior art.
Figure 1C:
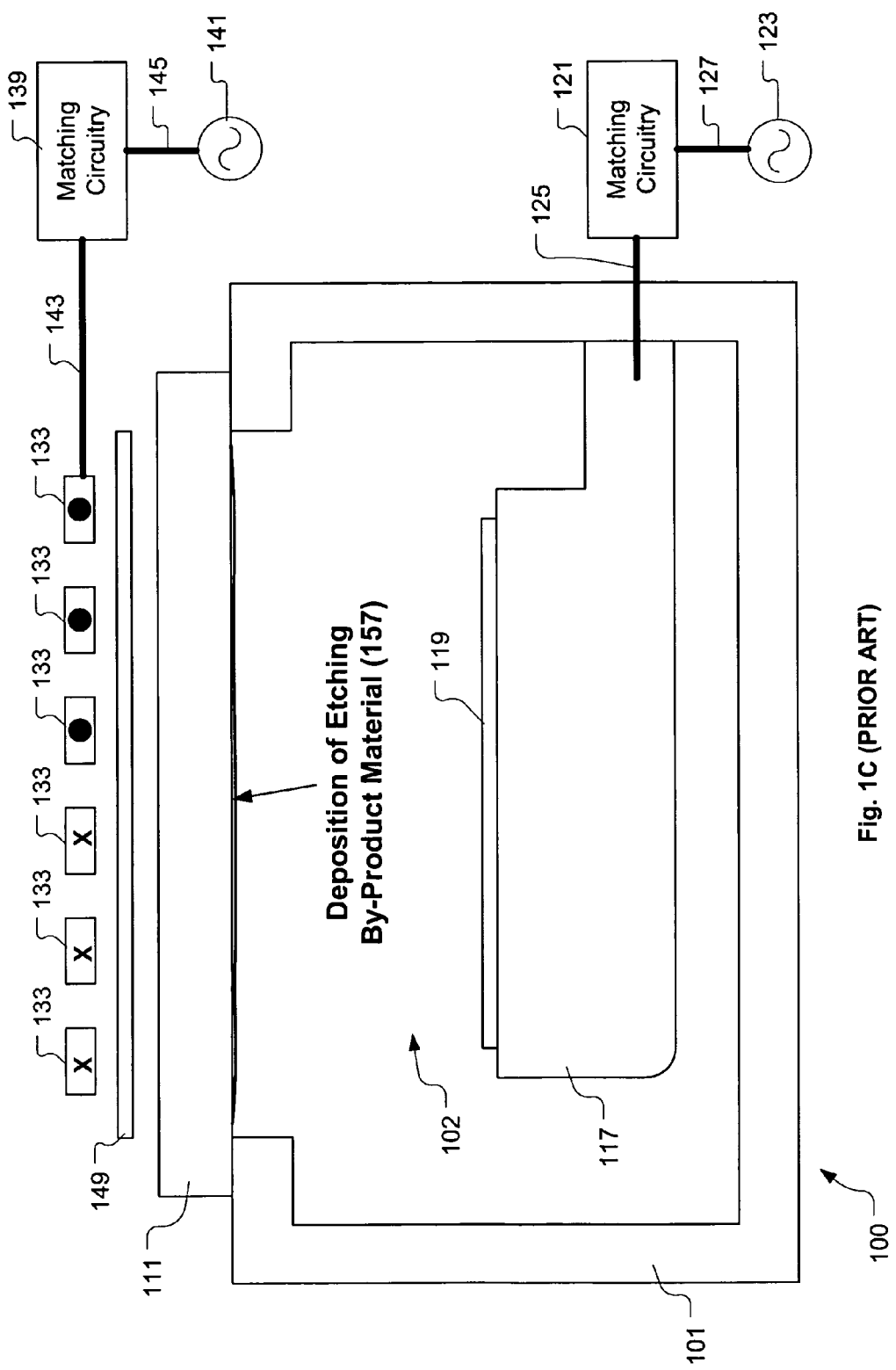
FIG. 1C shows an illustration of a deposition 157 of non-volatile reaction products on the window 111 in accordance with the prior art.
Figure 1D:
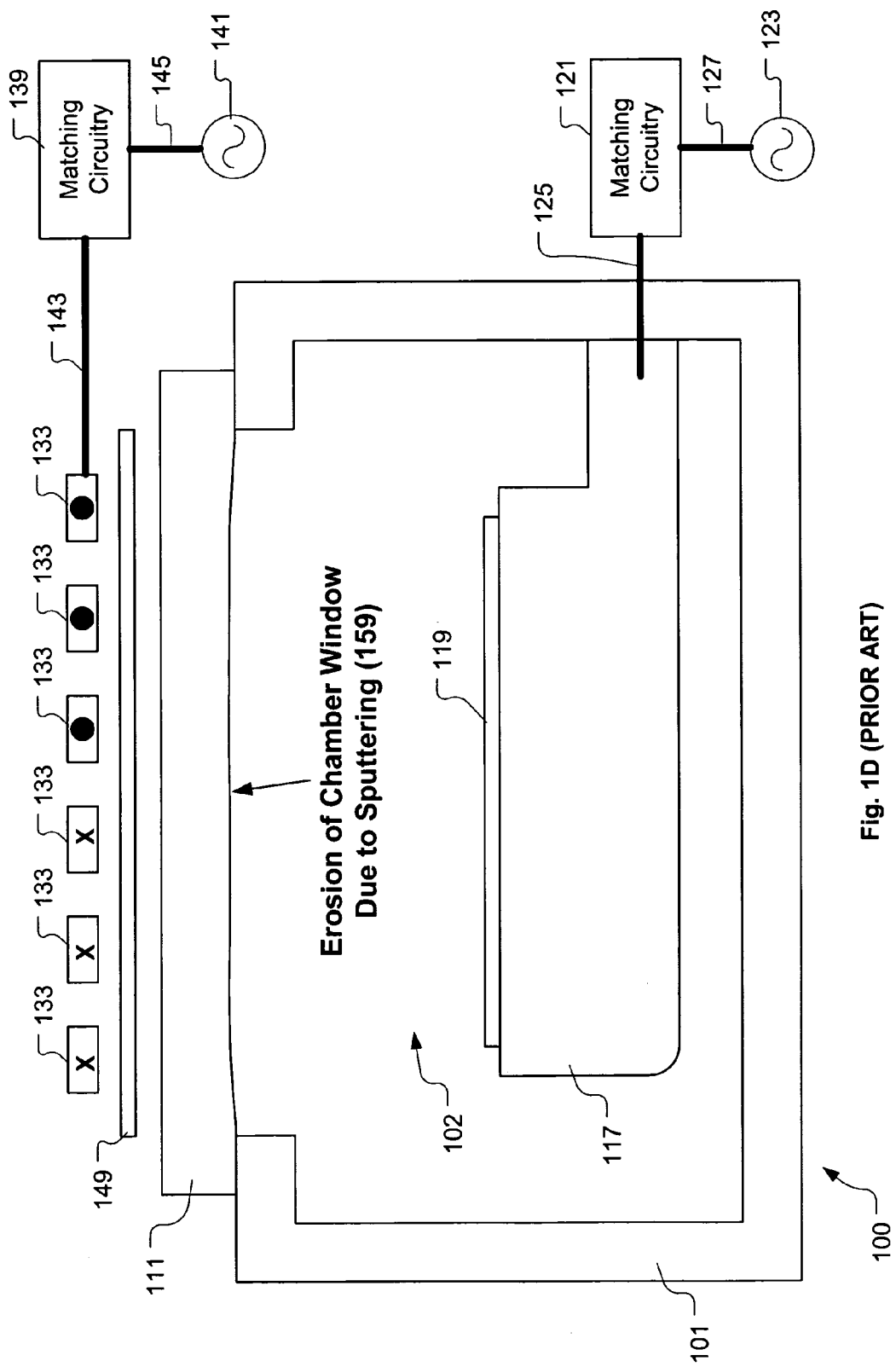
FIG. 1D shows an illustration of window 111 erosion 159 in accordance with the prior art.
Figure 2:
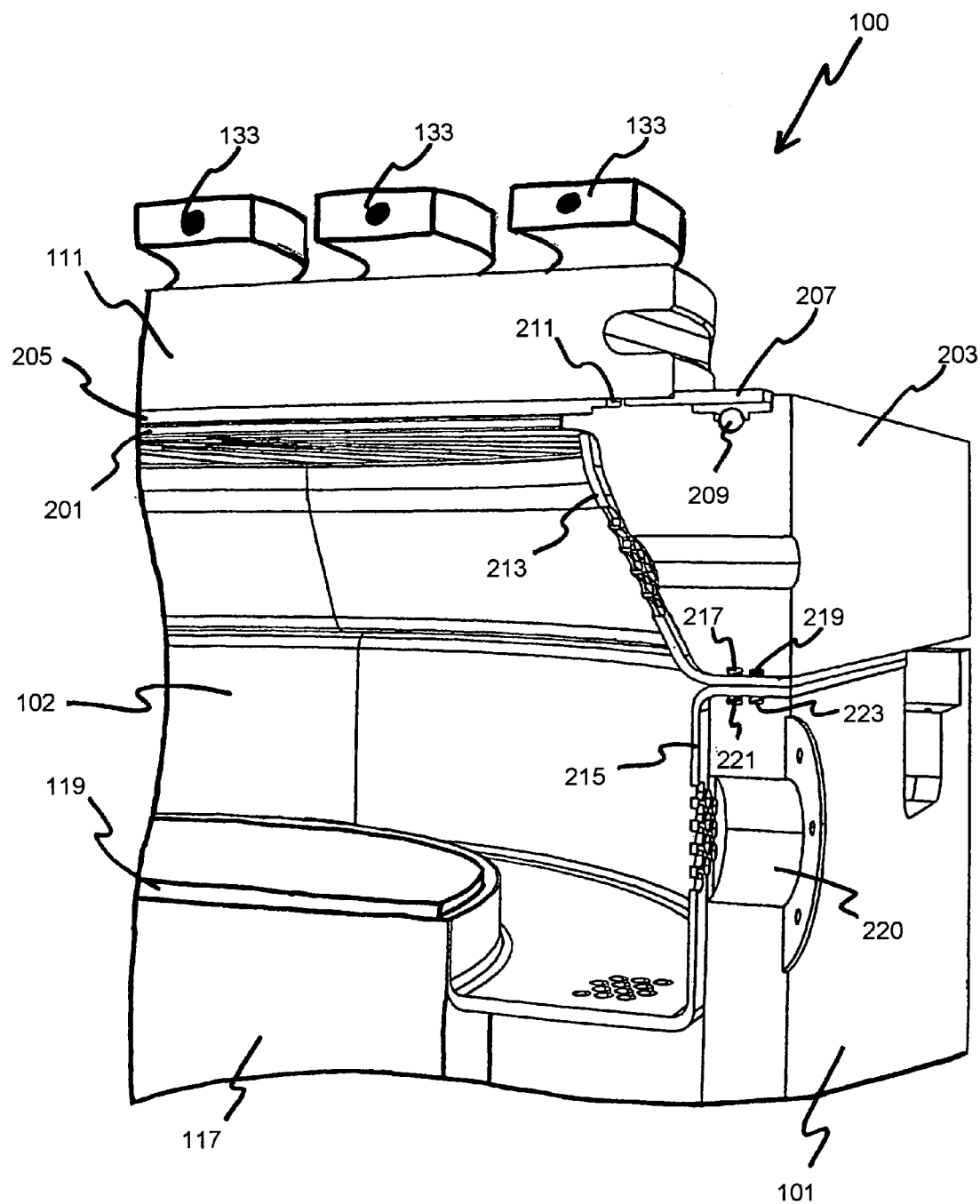
FIG. 2 shows an illustration of an inductively coupled plasma etching apparatus 100 having a Faraday shield 201 that is integral with the adapter plate 203 in accordance with one embodiment of the present invention.

FIG. 2 shows an illustration of an inductively coupled plasma etching apparatus 100 having a Faraday shield 201 that is integral with the adapter plate 203 in accordance with one embodiment of the present invention. The inductively coupled plasma etching apparatus 100 includes an etching chamber structurally defined by chamber walls 101, an adapter plate 203, and a window 111. The chamber walls 101 and adapter plate 203 are typically fabricated from aluminum or stainless steel; however, other suitable materials may also be used. The window 111 is typically fabricated from quartz; however, other materials such as alumina ($Al_2O_3$), silicon nitride ($Si_3N_4$), aluminum nitride (AlN), silicon carbide (SiC), and silicon (Si) may also be used. An o-ring 211 is used to provide a vacuum seal between the window 111 and the adapter plate 203. The window 111 position is maintained by a bumper 207. A heater 209 is located below the bumper 207 in a channel provided within the adapter plate 203. The heater 209 is used to prevent the existence of cold surfaces which could adversely affect the etching process. The heater 209 is generally used to maintain the adapter plate 203 temperature within a range from about 50° C. to about 70° C. However, during the etching process, adapter plate 203 temperatures may exceed the heater 209 operational range, thus eliminating the need to operate the heater 209.

An adapter plate liner 213 is configured to cover the adapter plate 203 surface exposed to a chamber internal cavity 102. The adapter plate liner 213 also extends between the chamber walls 101 and the adapter plate 203. The adapter plate liner 213 thickness is nominally about 0.06 inch. However, the adapter plate liner 213 thickness may be larger or smaller depending on the etching chamber configuration and etching process requirements. Typically, there is a region of free space between the adapter plate liner 213 and the adapter plate 203. Therefore, an o-ring 217 is used to provide a vacuum seal between the adapter plate liner 213 and the adapter plate 203 at a location between the adapter plate 203 and the chamber walls 101. An RF gasket 219 is provided outside of the o-ring 217 to maintain continuity of ground between the adapter plate liner 213 and the adapter plate 203.

A chuck 117 is positioned near the bottom inner surface of the etching chamber. The chuck 117 is configured to receive and hold a semiconductor wafer (i.e., "wafer") 119 upon which the etching process is performed. The chuck 117 can be electrically charged using an RF power supply (not shown). A bucket liner 215 is configured to form an annular trough surrounding the chuck 117. The bucket liner 215 is further configured to cover the chamber walls 101 extending upward from the annular trough. The bucket liner 215 also extends between the chamber walls 101 and the adapter plate 203. Typically, there is a region of free space between the bucket liner 215 and the chamber walls 101. Therefore, an o-ring 221 is used to provide a vacuum seal between the bucket liner 215 and the chamber walls 101 at a location between the adapter plate 203 and the chamber walls 101.

An RF gasket 223 is provided outside of the o-ring 221 to maintain continuity of ground between the bucket liner 215 and the chamber walls 101.

A coil 133 composed of an electrically conductive material and including at least one complete turn is configured above the window 111. The exemplary coil 133 shown in FIG. 2 includes three turns. The coil 133 symbols having a "•" indicate that the coil 133 extends rotationally out of the page. The coil 133 is configured to be substantially parallel to the window 111. Additionally, an RF power supply (not shown) is configured to supply RF power to the coil 133.

The Faraday shield 201 is positioned immediately below the window 111 to be directly exposed to the chamber internal cavity 102. The Faraday shield 201 is configured to be substantially parallel to the window 111. The Faraday shield 201 generally has a thickness ranging from about 0.03 inch to about 1 inch. A nominal Faraday shield 201 thickness is about 0.19 inch. The Faraday shield 201 is generally composed of an electrically conductive material such as aluminum. Hence, the Faraday shield 201 is also referred to as a metal shield 201. The Faraday shield 201 may also be coated or anodized with a material compatible with the etching process environment such as alumina. Depending on the Faraday shield 201 configuration, the coating thickness can range from about 0.002 inch to about 0.01 inch. Numerous other Faraday shield 201 and coating materials may be used so long as the Faraday shield 201 functionality is not compromised.

A space 205 exists between the Faraday shield and the window 111. A distance across the space 205 perpendicular to both the Faraday shield 201 and the window 111 is generally within the range from about 0.005 inch to 0.04 inch. A nominal perpendicular distance across the space 205 is about 0.02 inch. As previously mentioned, the Faraday shield 201 shown in FIG. 2 is an integral part of the adapter plate 203. Thus, since the adapter plate 203 is grounded, the Faraday shield 201 is also grounded. In some etching processes, however, it may be beneficial to have the Faraday shield 201 electrically charged. The Faraday shield 201 is typically configured to have a plurality of slots oriented to be perpendicular to the direction of the coil 133 turns. The plurality of slots are provided to disrupt a flow of electric current induced by the coil 133 through the Faraday shield 201. A current flowing through the Faraday shield 201 can electrically shield a plasma from the coil 133, thus extinguishing the plasma.

During operation, a reactant gas flows through the etching chamber from a gas lead-in port 220 to a gas exhaust port (not shown). High frequency power (i.e., RF power) is then applied from a power supply (not shown) to the coil 133 to cause an RF current to flow through the coil 133. The RF current flowing through the coil 133 generates an electromagnetic field about the coil 133. The electromagnetic field generates an inductive current within the etching chamber. The inductive current acts on the reactant gas to generate the plasma. High frequency power (i.e., RF power) is applied from a power supply (not shown) to the chuck 117 to provide directionality to the plasma such that the plasma is "pulled" down onto the wafer 119 surface to effect the etching process.

The plasma contains various types of radicals in the form of positive and negative ions. The chemical reactions of the various types of positive and negative ions are used to etch the wafer 119. During the etching process, the coil 133 performs a function analogous to that of a primary coil in a transformer, while the plasma performs a function analogous to that of a secondary coil in the transformer.

During operation, the Faraday shield 201 ensures that an electrostatic field generated between the coil 133 and the plasma is uniformly distributed across the window 111 interior surface. With the Faraday shield 201 configured below the window 111 and in direct exposure to the plasma, the Faraday shield intercepts plasma sputtering toward the window 111, thus preventing window 111 erosion generally caused by plasma sputter. The Faraday shield also intercepts the heat flux generated by the etching process occurring in the chamber internal cavity 102. The integral configuration of the Faraday shield with the adapter plate 203 creates an efficient thermal conduction path to shunt heat away from the window 111. Hence, the window 111 temperatures are lowered, and the temperature gradient across the window surface is substantially decreased. Configuring the Faraday shield 201 to be inside the chamber internal cavity 102, below the window 111, and in direct exposure to the plasma serves to protect the window 111 from etching by-product deposition, plasma sputter induced erosion, and thermal stresses caused by large temperature gradients.

Figure 3A:
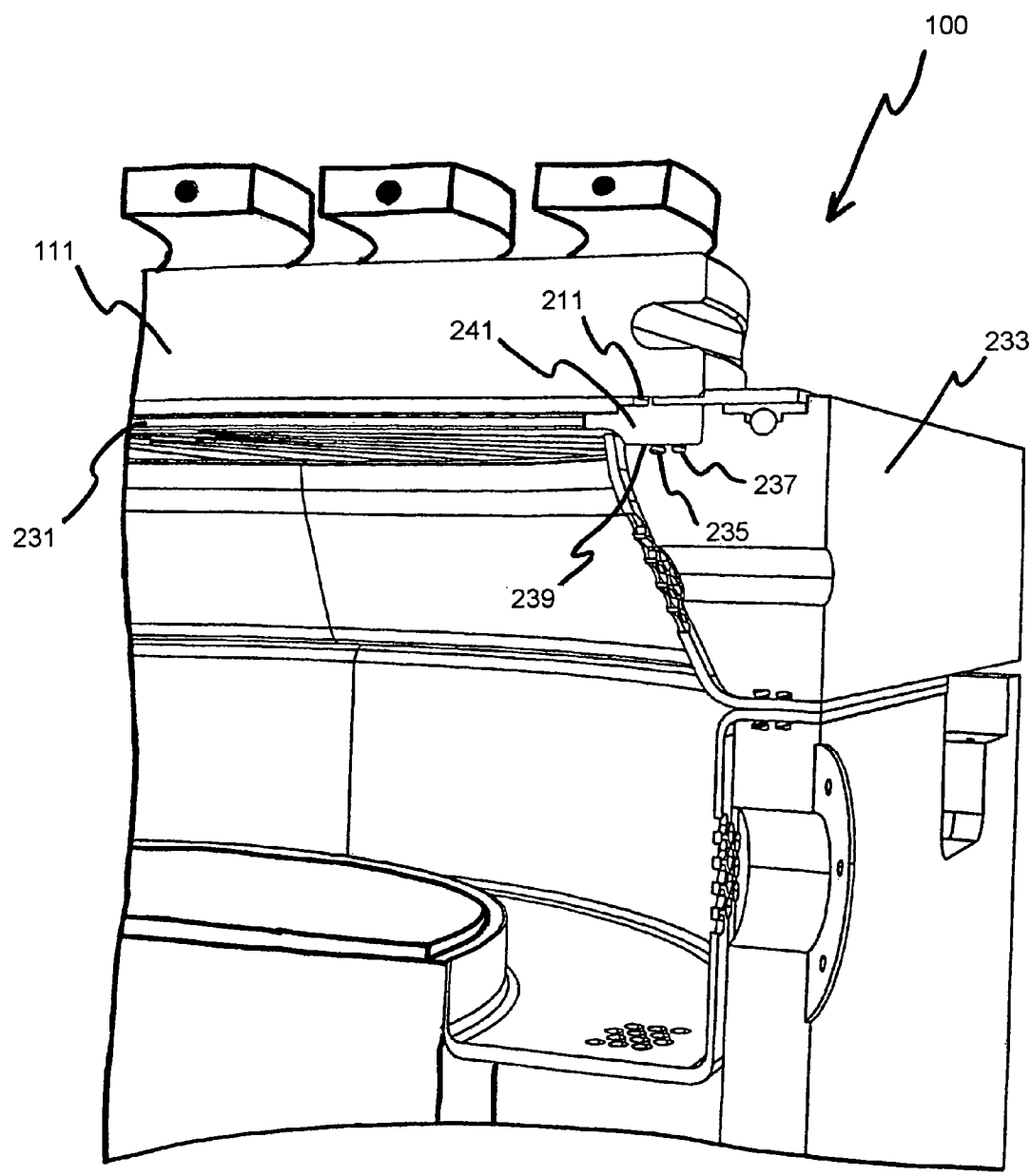
FIG. 3A shows an illustration of an inductively coupled plasma etching apparatus 100 having a Faraday shield 231 that is configured to mate with a channel 239 in an adapter plate 233 in accordance with one embodiment of the present invention.

FIG. 3A shows an illustration of an inductively coupled plasma etching apparatus 100 having a Faraday shield 231 that is configured to mate with a channel 239 in an adapter plate 233 in accordance with one embodiment of the present invention. The Faraday shield 231 characteristics are the same as those previously described for the Faraday shield 201 shown in FIG. 2 with the exception of the features described below.

The Faraday shield 231 includes a surrounding ring 241 configured to mate with the channel 239 provided in the adapter plate 233. The o-ring 211 provides a vacuum seal between the window 111 and the surrounding ring 241. Similarly, an o-ring 235 provides a vacuum seal between the adapter plate 233 and the surrounding ring 241. The Faraday shield 231 and surrounding ring 241 are both electrically conductive and are grounded to the adapter plate 233 by an RF gasket 237. The Faraday shield 231 and surrounding ring 241 have the beneficial feature of being easy to access and remove from the adapter plate 233 for routine maintenance or replacement.

Figure 3B:
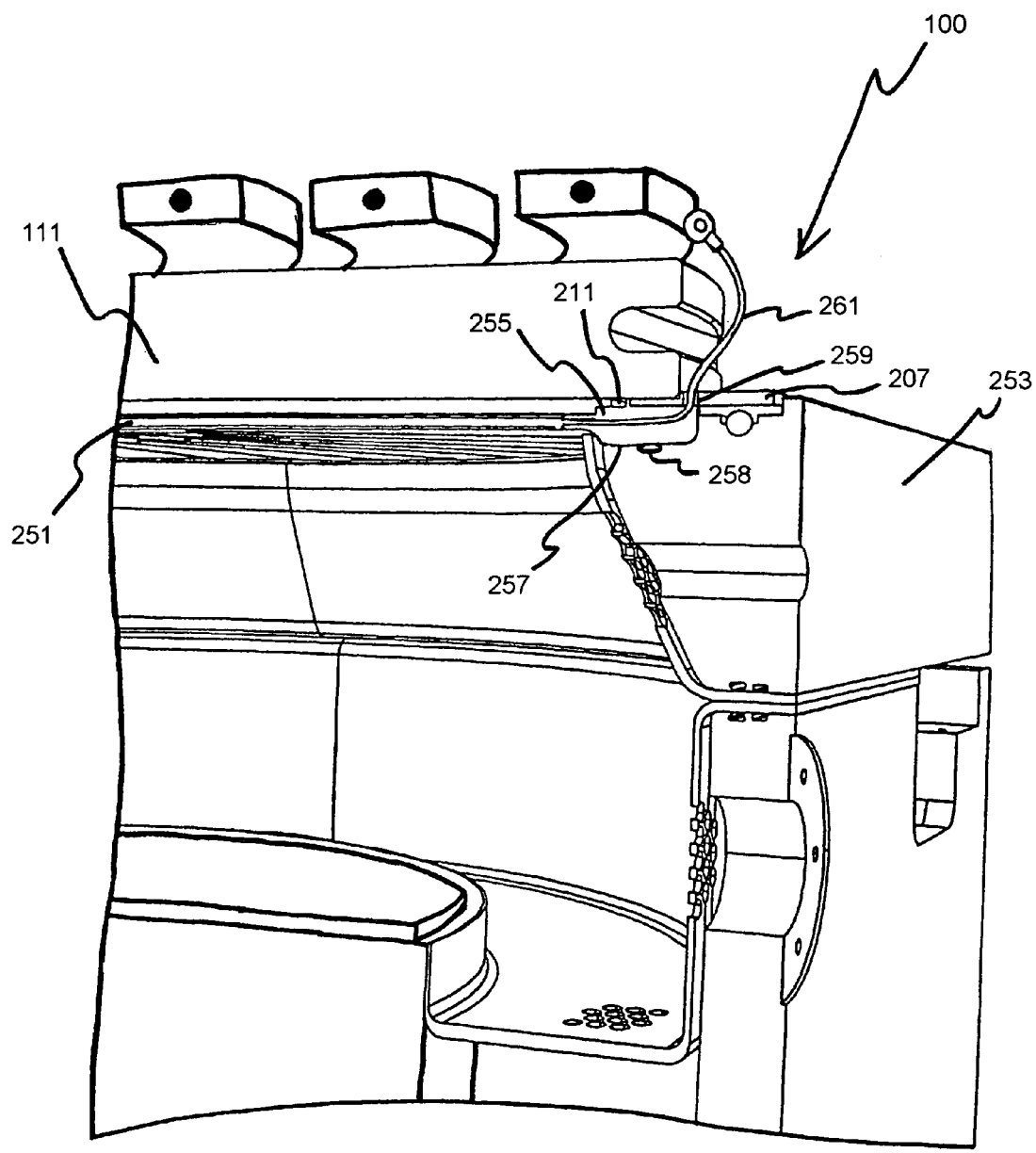
FIG. 3B shows an illustration of an inductively coupled plasma etching apparatus 100 having a Faraday shield 251 that is configured to mate with a channel 257 in an adapter plate 253 in accordance with one embodiment of the present invention.

FIG. 3B shows an illustration of an inductively coupled plasma etching apparatus 100 having a Faraday shield 251 that is configured to mate with a channel 257 in an adapter plate 253 in accordance with one embodiment of the present invention. The Faraday shield 251 characteristics are the same as those previously described for the Faraday shield 201 shown in FIG. 2 with the exception of the features described below.

The Faraday shield 251 includes a surrounding insulating ring 255 configured to mate with the channel 257 provided in the adapter plate 253. The o-ring 211 provides a vacuum seal between the window 111 and the surrounding insulating ring 255. Similarly, an o-ring 258 provides a vacuum seal between the adapter plate 253 and the surrounding insulating ring 255. The Faraday shield 251 is electrically conductive and electrically isolated from the adapter plate 253 by the surrounding insulating ring 255. An electrical conductor 261 is connected to the Faraday shield 251 through an insulated penetration 259 in the bumper 207. A voltage can be applied to the electrical conductor 261 to electrically charge the Faraday shield 251. Some etching processes may benefit from the Faraday shield 251 being electrically charged. The Faraday shield 251 and surrounding insulating ring 255 have the beneficial feature of being easy to access and remove from the adapter plate 253 for routine maintenance or replacement.

Figure 4:
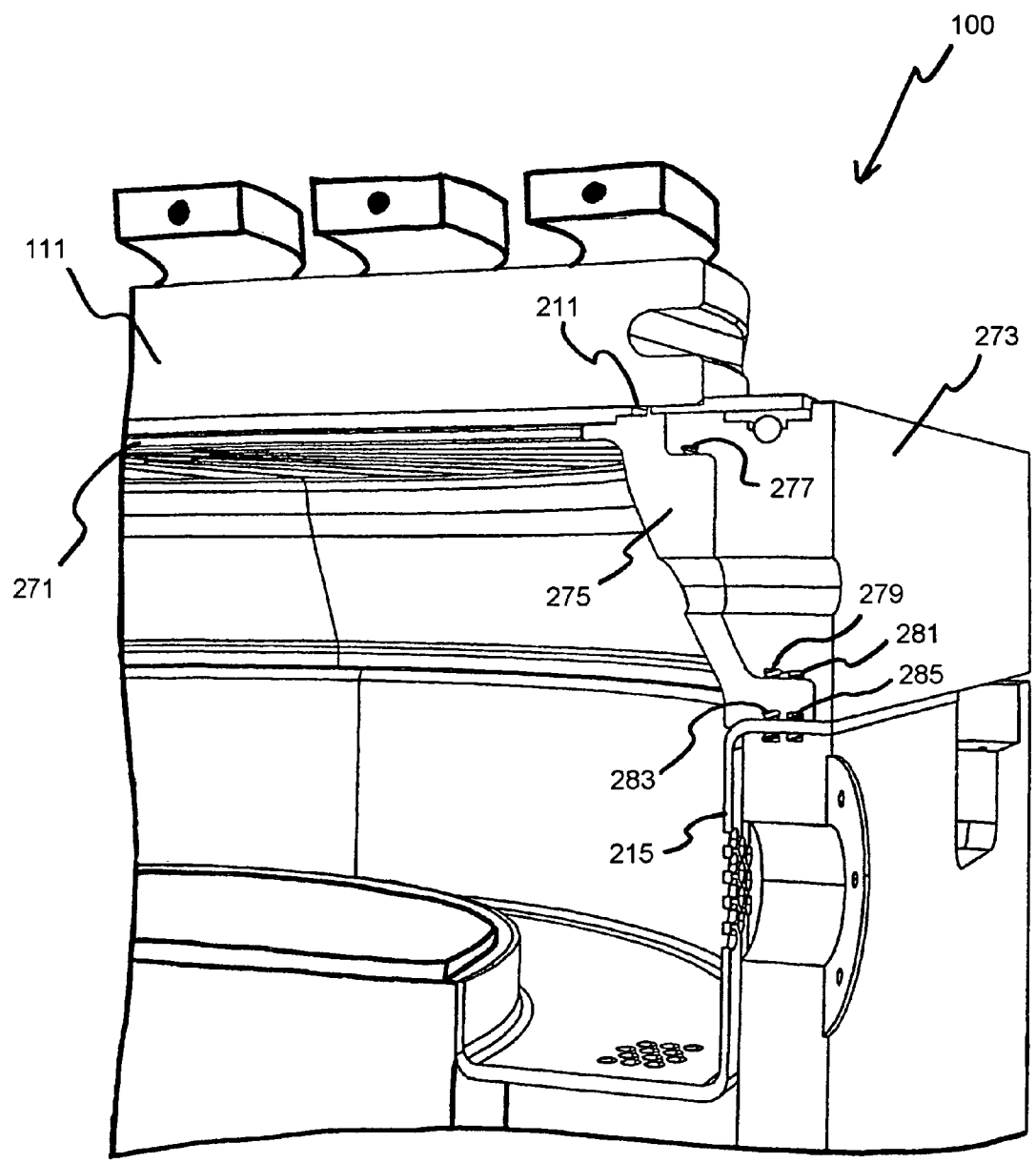
FIG. 4 shows an illustration of an inductively coupled plasma etching apparatus 100 having a Faraday shield 271 configured with a radial support body 275 that is contoured to be bottom-inserted within an adapter plate 273 in accordance with one embodiment of the present invention.

FIG. 4 shows an illustration of an inductively coupled plasma etching apparatus 100 having a Faraday shield 271 configured with a radial support body 275 that is contoured to be bottom-inserted within an adapter plate 273 in accordance with one embodiment of the present invention. The Faraday shield 271 characteristics are the same as those previously described for the Faraday shield 201 shown in FIG. 2 with the exception of the features described below.

The Faraday shield 271 includes a radial support body 275 contoured to be bottom-inserted within the adapter plate 273. The contour of the radial support body 275 mates with a complementary contour on the adapter plate 273. The o-ring 211 provides a vacuum seal between the window 111 and the radial support body 275. Similarly, an o-ring 277 and an o-ring 279 provide a vacuum seal between the adapter plate 273 and the radial support body 275. An o-ring 283 provides a vacuum seal between the bucket liner-215 and the radial support body 275. The Faraday shield 271 and the radial support body 275 are both electrically conductive and are grounded to the adapter plate 273 by an RF gasket 281. The radial support body 275 is further grounded to the bucket liner 215 by an RF gasket 285. The Faraday shield 271 and the radial support body 275 have the beneficial feature of being easy to access and remove from the adapter plate 273 for routine maintenance or replacement. Also, the adapter plate 273 can be removed from the etching apparatus without removing the Faraday shield 271 and the radial support body 275.

Figure 5:
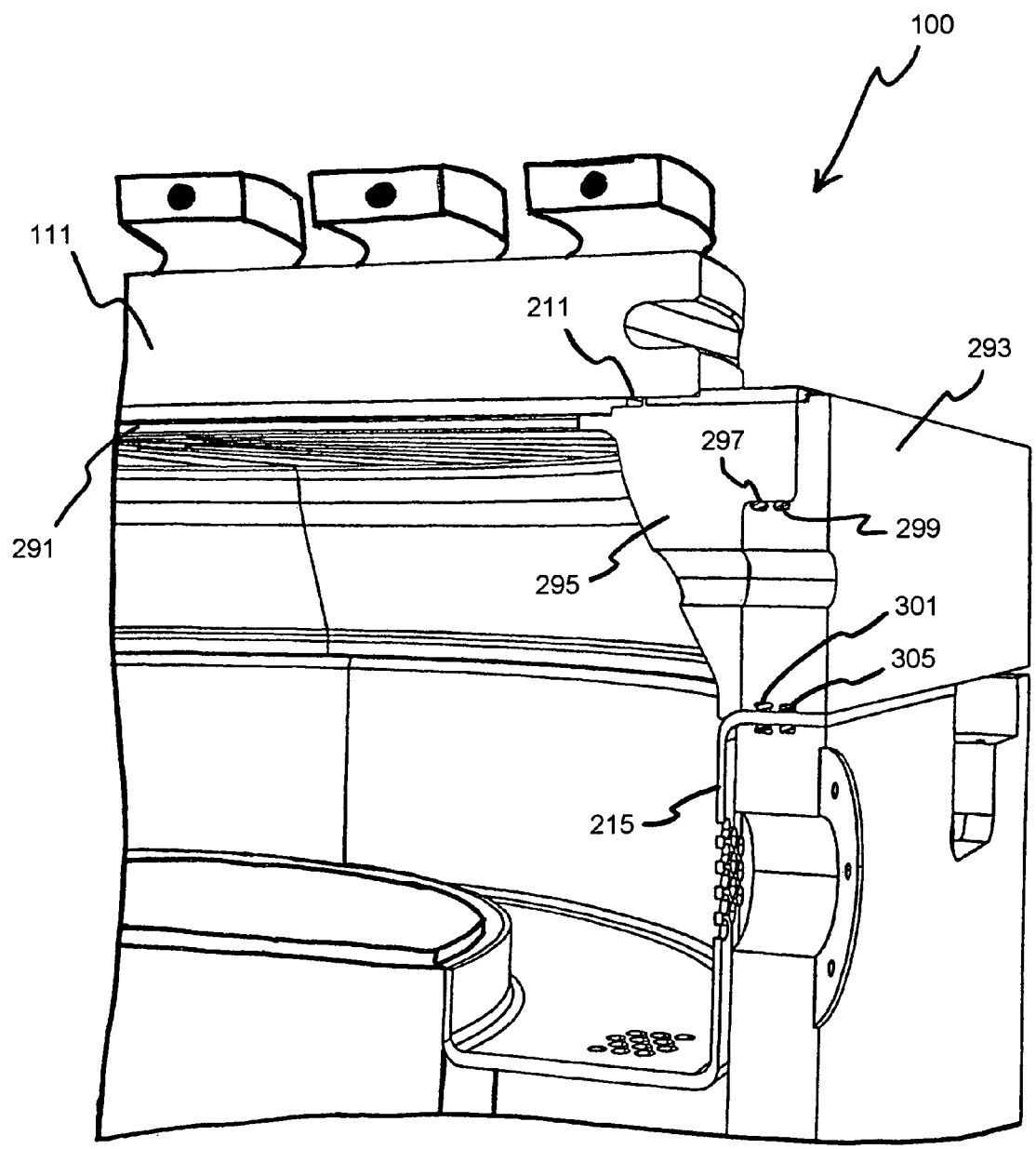
FIG. 5 shows an illustration of an inductively coupled plasma etching apparatus 100 having a Faraday shield 291 configured with a radial support body 295 that is contoured to be top-inserted within an adapter plate 293 in accordance with one embodiment of the present invention.

FIG. 5 shows an illustration of an inductively coupled plasma etching apparatus 100 having a Faraday shield 291 configured with a radial support body 295 that is contoured to be top-inserted within an adapter plate 293 in accordance with one embodiment of the present invention. The Faraday shield 291 characteristics are the same as those previously described for the Faraday shield 201 shown in FIG. 2 with the exception of the features described below.

The Faraday shield 291 includes a radial support body 295 contoured to be top-inserted within the adapter plate 293. The contour of the radial support body 295 mates with a complementary contour on the adapter plate 293. The o-ring 211 provides a vacuum seal between the window 111 and the radial support body 295. Similarly, an o-ring 297 provides a vacuum seal between the adapter plate 293 and the radial support body 295. An o-ring 301 provides a vacuum seal between the bucket liner 215 and the adapter plate 293. The Faraday shield 291 and the radial support body 295 are both electrically conductive and are grounded to the adapter plate 293 by an RF gasket 299. Continuity of ground is also provided by an RF gasket 305 between the adapter plate 293 and the bucket liner 215. The Faraday shield 291 and the radial support body 295 have the beneficial feature of being easy to access and remove from the adapter plate 293 for routine maintenance or replacement. Also, the Faraday shield 291 and the radial support body 295 can be removed without removing the adapter plate 293.

Figure 6:
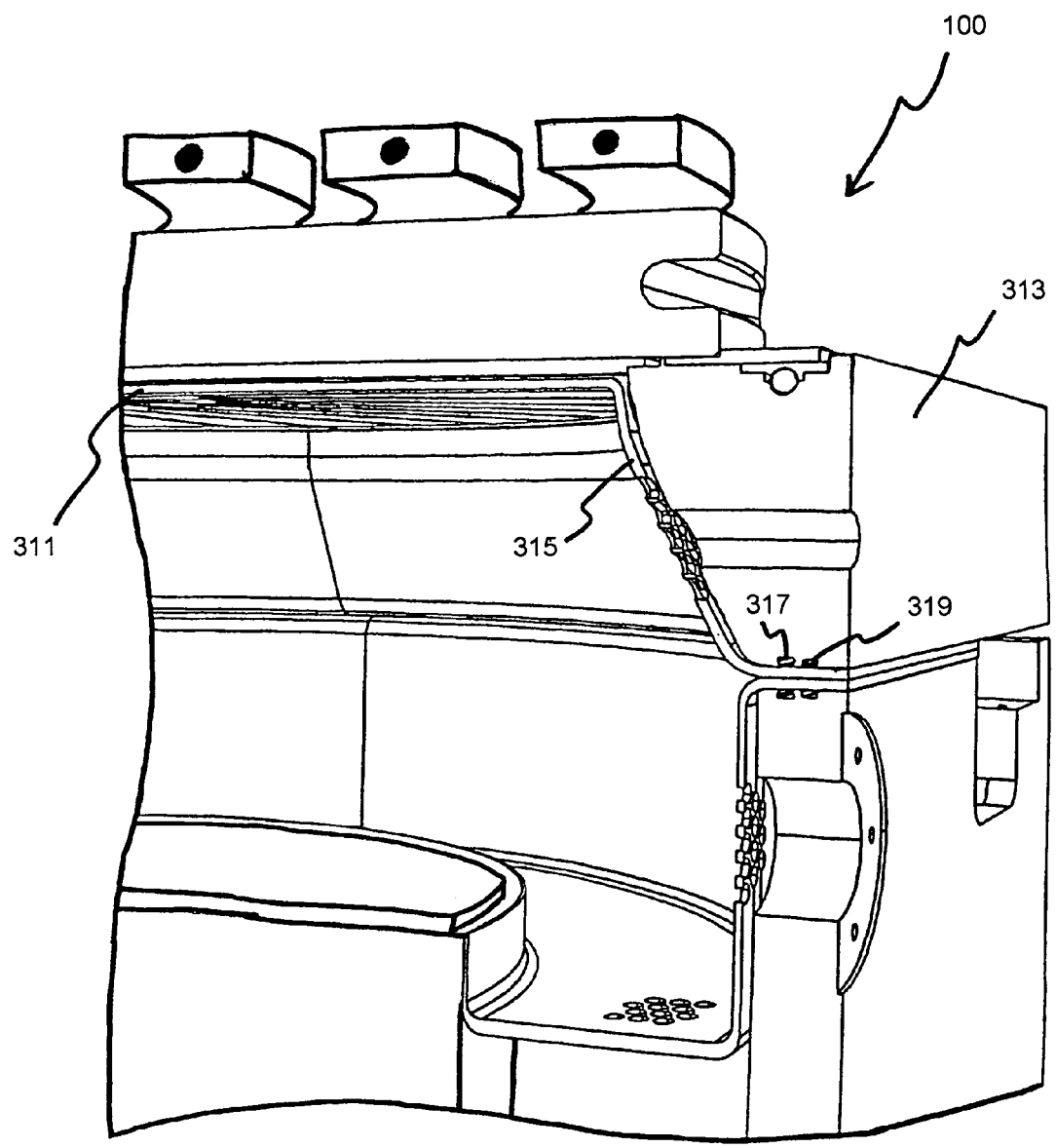
FIG. 6 shows an illustration of an inductively coupled plasma etching apparatus 100 having a Faraday shield 311 that is configured to be integral with an adapter plate liner 315 in accordance with one embodiment of the present invention.

FIG. 6 shows an illustration of an inductively coupled plasma etching apparatus 100 having a Faraday shield 311 that is configured to be integral with an adapter plate liner 315 in accordance with one embodiment of the present invention. The Faraday shield 311 characteristics are the same as those previously described for the Faraday shield 201 shown in FIG. 2 with the exception of the features described below.

The Faraday shield 311 is integral with the adapter plate liner 315. An o-ring 317 provides a vacuum seal between the Faraday shield 311 and adapter plate liner 315 combination and an adapter plate 313. The Faraday shield 311 and adapter plate liner 315 combination is electrically conductive and is grounded to the adapter plate 313 by an RF gasket 319. The Faraday shield 311 and adapter plate liner 315 combination has the beneficial feature of being easy to access and remove from the adapter plate 313 for routine maintenance or replacement.

FIGS. 7–10 show illustrations of a number of alternate Faraday shield configurations in accordance with exemplary embodiments of the present invention. The Faraday shield is composed of an electrically conductive material such as metal. Since the Faraday shield is exposed to the electromagnetic field generated by the coil 133, an electric current is capable of being induced within the Faraday shield. The electric current induced in the Faraday shield will generally flow in a direction corresponding to the coil 133 turns. Since the coil 133 is typically turned in a circular manner, the electric current induced in the Faraday shield will typically flow in a circular direction about the center of the coil 133 (i.e., the center of the etching chamber). The presence of an electric current on the Faraday shield can be detrimental to the etching process by electrically shielding the plasma from the coil 133. Thus, the electric current on the Faraday shield disrupts the required electrical communication between the coil 133 and the plasma. Therefore, it is necessary to disrupt the flow of electric current on the Faraday shield. A plurality of slots are provided on the Faraday shield to disrupt the flow of the induced electric current. The plurality of slots are generally oriented in an outwardly radiating direction from the center of the chamber. Hence, the plurality of slots are configured to be perpendicular to the direction in which the coil 133 is turned.

FIG. 7 shows an illustration of a top view of a Faraday shield 401 configured within an adapter plate 403 in accordance with an exemplary embodiment of the present invention. A plurality of slots 405 are provided to disrupt the flow of electric current induced by the coil 133.

FIG. 8 shows an illustration of a top view of a Faraday shield 407 configured within an adapter plate 403 in accordance with an exemplary embodiment of the present invention. A plurality of slots 409 are provided to disrupt the flow of electric current induced by the coil 133.

FIG. 9 shows an illustration of a Faraday shield 411 in accordance with an exemplary embodiment of the present invention. A plurality of slots 413 are provided to disrupt the flow of electric current induced by the coil 133.

FIG. 10 shows an illustration of a two-part Faraday shield assembly 419 in accordance with an exemplary embodiment of the present invention. The two-part Faraday shield assembly 419 includes a dielectric-coated star-pattern insert 415 and a complementary dielectric-coated receiving member 417. Insertion of the star-pattern insert 415 into the complementary receiving member 417 results is the creation of a plurality of slots 421. The plurality of slots 421 disrupt the flow of electric current induced by the coil 133. Disassembly of the two-part Faraday shield assembly 419 provides easy access to interior surfaces of the plurality of slots 421. Access to the interior surfaces of the plurality of slots 421 is beneficial for applying a coating material to the Faraday shield assembly 419.

FIG. 11 shows an illustration of an exemplary temperature distribution across a quartz window directly exposed to the plasma in accordance with the prior art. In the example of FIG. 11, the quartz window is one inch thick. The quartz window temperature distribution corresponds to a plasma power of 100 W. The maximum quartz window temperature of 220° C. occurs at a location 161 substantially near the center of the quartz window surface exposed to the plasma.

The minimum quartz window temperature of 100° C. occurs at a location 163 substantially near the edge of the quartz window surface opposite the plasma. Thus, direct exposure of the quartz window to the 100 W plasma results in a temperature difference of 120° C. between the center and the edge of the quartz window. Also, the temperature gradient is quite large near the edge of the quartz window. Since quartz has a very low coefficient of thermal expansion, the quartz window can withstand the large temperature gradient experienced during the etching process. However, the quartz window is quite susceptible to erosion caused by plasma sputter. Therefore, placement of the Faraday shield below the quartz window is desirable to protect the window from the erosive effects of the plasma sputter.

FIG. 12 shows an illustration of an exemplary temperature distribution across the quartz window when the Faraday shield is disposed substantially near the window inside the inductively coupled plasma etching chamber in accordance with one embodiment of the present invention. As in the example of FIG. 11, the quartz window in FIG. 12 is one inch thick. Also, the quartz window temperature distribution corresponds to a plasma power of 100 W. A maximum quartz window temperature of 90° C. occurs at a location 501 substantially near the center of the quartz window surface exposed to the plasma. Similarly, a maximum Faraday shield temperature of 110° C. occurs at a location 505 substantially near the center of the Faraday shield. A minimum quartz window temperature of 75° C. occurs at a location 503 substantially near the edge of the quartz window surface opposite the plasma. Thus, the maximum-to-minimum temperature difference from the center to the edge of the quartz window is approximately 15° C. with the Faraday shield located below the quartz window. Also, placement of the Faraday shield below the quartz window significantly reduces the temperature gradient present from the center to the edge of the quartz window.

For the example etching process considered in FIGS. 11 and 12, the presence of the Faraday shield below the quartz window as opposed to above the quartz window decreases the maximum and minimum temperatures by about 59% and about 25%, respectively. Also, the temperature gradient from the center to the edge of the quartz window is significantly reduced with the Faraday shield located below the quartz window and inside the etching chamber. With the decreased temperature gradient afforded by placement of the Faraday shield below the window, other stronger, more durable, and less expensive window materials (e.g., ceramic) can be considered for use in conjunction with higher power, higher temperature etching processes.

FIG. 13 shows an illustration of an exemplary temperature distribution across a ceramic (e.g., $Al_2O_3$) window directly exposed to the plasma in accordance with the prior art. In the example of FIG. 13, the ceramic window is one inch thick. The ceramic window temperature distribution corresponds to a plasma power of 100 W. The maximum ceramic window temperature of 110° C. occurs at a location 165 substantially near the center of the ceramic window surface exposed to the plasma. The minimum ceramic window temperature of 90° C. occurs at a location 167 substantially near the edge of the ceramic window surface opposite the plasma. Thus, direct exposure of the ceramic window to the 100 W plasma results in a temperature difference of 20° C. between the center and the edge of the ceramic window. This temperature difference is less than the corresponding temperature difference of 120° C. for the quartz window due to the ceramic window's higher thermal conductivity. However, the ceramic window has a larger coefficient of thermal expansion than the quartz window. Thus, the presence of a large temperature gradient across the ceramic window may result in non-uniform thermal expansion and subsequent failure of the ceramic window. However, relative to quartz the ceramic window is stronger, more durable, and less expensive. Therefore, placement of the Faraday shield below the ceramic window is desirable not only for shielding the window from direct exposure to the plasma but also for shunting heat away from the window toward the adapter plate.

FIG. 14 shows an illustration of an exemplary temperature distribution across the ceramic window when a 0.19 inch thick Faraday shield is disposed substantially near the window inside the inductively coupled plasma etching chamber in accordance with one embodiment of the present invention. As in the example of FIG. 13, the ceramic window in FIG. 14 is one inch thick. Also, the temperature distribution corresponds to a plasma power of 100 W. A maximum Faraday shield temperature of 110° C. occurs at a location 515 substantially near the center of the Faraday shield. The temperature distribution from a location 511 near the center of the ceramic window to a location 513 near the edge of the ceramic window is approximately constant at 75° C. Thus, placement of the Faraday shield below the ceramic window results in a vanishingly small temperature gradient from the center to the edge of the ceramic window. Such a small temperature gradient allows the ceramic window to be used in higher power, higher temperature etching processes without experiencing cracking and failure due to non-uniform thermal expansion.

For the example etching process considered in FIGS. 13 and 14, the presence of the Faraday shield below the ceramic window as opposed to above the ceramic window decreases the maximum and minimum ceramic window temperatures by about 32% and about 17%, respectively. Also, the temperature gradient from the center to the edge of the ceramic window is significantly reduced with the Faraday shield located below the ceramic window and inside the etching chamber. In addition to minimizing the temperature gradient across the ceramic window, it may also be desirable in some etching processes to reduce the maximum Faraday shield temperature.

FIG. 15 shows an illustration of an exemplary temperature distribution across the ceramic window when a 0.38 inch thick Faraday shield is disposed substantially near the window inside the inductively coupled plasma etching chamber in accordance with one embodiment of the present invention. As in the examples of FIGS. 13 and 14, the ceramic window in FIG. 15 is one inch thick. Also, the temperature distribution corresponds to a plasma power of 100 W. The temperature distribution from a location 517 near the center of the ceramic window to a location 519 near the edge of the ceramic window remains approximately constant at 75° C. A maximum Faraday shield temperature of 90° C. occurs at a location 521 substantially near the center of the Faraday shield. Thus, increasing the Faraday shield thickness by about a factor of two from 0.19 inch to 0.38 inch results in approximately a 18% decrease in maximum Faraday shield temperature. The decrease in temperature is a result of increased thermal conductance to the adapter plate as afforded by the thicker Faraday shield.

FIG. 16 shows an illustration of an exemplary temperature distribution across the ceramic window when a 0.56 inch thick Faraday shield is disposed substantially near the window inside the inductively coupled plasma etching chamber in accordance with one embodiment of the present invention. As in the examples of FIGS. 13, 14, and 15, the ceramic window in FIG. 16 is one inch thick. Also, the temperature distribution corresponds to a plasma power of 100 W. The temperature distribution from a location 523 near the center of the ceramic window to a location 525 near the edge of the ceramic window remains approximately constant at 75° C. A maximum Faraday shield temperature of 85° C. occurs at a location 527 substantially near the center of the Faraday shield. Thus, increasing the Faraday shield thickness by about a factor of three from 0.19 inch to 0.56 inch results in approximately a 23% decrease in maximum Faraday shield temperature. As in the example of FIG. 15, the decrease in temperature is a result of increased thermal conductance to the adapter plate as afforded by the thicker Faraday shield.

As shown in FIGS. 11–16, the thermal conduction path between the Faraday shield and the adapter plate 203 is effective in shunting heat away from the window 111. Thus, FIGS. 11–16 demonstrate that the adapter plate 203 is a thermally conductive member having sufficient mass to effectively serve as a heat dissipation structure for the Faraday shield.

FIG. 17 shows a flowchart of a method for making an inductively coupled plasma etching apparatus in accordance with one embodiment of the present invention. The method includes a step 601 for providing a chamber having an interior cavity defined by a bottom, side walls, and a top having an opening. The method further includes a step 603 wherein a metal shield to be placed within the chamber interior cavity is coated, if required by the etching process parameters. The method also includes a step 605 wherein the metal shield is electrically isolated, if required by the etching process parameters. The method includes another step 607 wherein the metal shield is placed within the chamber interior cavity to cover the opening in the chamber top. In a step 609 of the method, a window is placed above the metal shield such that the window covers the opening in the chamber top and creates a vacuum seal with the outside of the chamber top. The method also includes a step 611 wherein a coil is placed above the window such that the coil and window are substantially parallel to each other.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for plasma processing, comprising:
a chamber defined by a bottom and surrounding walls;
a substrate support disposed within the chamber;
a thermally conductive adapter plate configured to interface with a top portion of the surrounding walls of the chamber, the adapter plate having a central opening defined to be positioned over the substrate support, wherein the adapter plate adapts a configuration of the surrounding walls of the chamber to a configuration of the central opening defined to be positioned over the substrate support;
a window defined to cover the central opening of the adapter plate, an outer region of the window being configured to sit over the adapter plate to enable a seal about the central opening between the outer region of the window and the adapter plate;
a metal shield disposed within the chamber over the substrate support, the metal shield being both proximate and parallel to the window, the metal shield being thermally connected to the adapter plate, wherein the adapter plate serves as a heat dissipation structure for the metal shield such that heat emanating from a plasma to be generated within the chamber is conducted through the metal shield to the adapter plate and away from the window.

2. An apparatus for plasma processing as recited in claim 1, wherein the metal shield is capable of conducting a flow of electrical current, the metal shield having a plurality of slits, the plurality of slits being configured to control the flow of electrical current.

3. An apparatus for plasma processing as recited in claim 1, wherein each of the adapter plate, the window, and the metal shield is capable of being removed from the chamber.

4. An apparatus for plasma processing as recited in claim 3, wherein the metal shield is configured to be integral with the adapter plate.

5. An apparatus for plasma processing as recited in claim 3, wherein the metal shield is configured to have a surrounding ring member, the surrounding ring member being configured to mate with a complementary channel present in the adapter plate, the metal shield further configured to be insertable and removable from the adapter plate.

6. An apparatus for plasma processing as recited in claim 5, wherein the metal shield is configured to be electrically isolated from the adapter plate, the metal shield being further configured to maintain an electrical charge.

7. An apparatus for plasma processing as recited in claim 3, wherein the metal shield is configured to have a surrounding support body, the surrounding support body having a contour configured to mate with a complementary contour present in the adapter plate, the metal shield further configured to be insertable and removable from the lower surface of the adapter plate.

8. An apparatus for plasma processing as recited in claim 3, wherein the metal shield is configured to have a surrounding support body, the surrounding support body having a contour configured to mate with a complementary contour present in the adapter plate, the metal shield further configured to be insertable and removable from the upper surface of the adapter plate.

9. An apparatus for plasma processing as recited in claim 3, further comprising an adapter plate liner, the adapter plate liner disposed adjacent to the lower surface of the adapter plate, the metal shield being configured to be integral with the adapter plate liner.

10. An apparatus for plasma processing as recited in claim 3, wherein the window is composed of a quartz material.

11. An apparatus for plasma processing as recited in claim 3, wherein the window is composed of a ceramic material.

12. An apparatus for plasma processing as recited in claim 1, wherein the metal shield is configured to be coated.

13. An apparatus for plasma processing as recited in claim 1, wherein the metal shield is configured to have a thickness, the thickness ranging from about 0.03 inch to about 1 inch.

14. An apparatus for plasma processing as recited in claim 1, wherein the metal shield proximity to the window ranges from about 0.005 inch to about 0.04 inch.

15. A plasma etching apparatus, comprising:
a chamber having an interior cavity defined by a bottom and side walls, wherein the side walls are configured to have a top surface;
a thermally conductive adapter plate configured to interface with the top surface of the side walls, the adapter plate having an upper surface and a lower surface, the adapter plate configured to have an opening centrally located above the interior cavity, wherein the adapter plate adapts a configuration of the chamber side walls to a configuration of the opening centrally located above the interior cavity;

a window having an outer region configured to interface with the upper surface of the adapter plate, whereby the window covers the opening in the adapter plate centrally located above the interior cavity; and a metal shield disposed immediately below the window and inside the chamber, the metal shield capable of being exposed directly to a plasma to be generated in the interior cavity, the metal shield being thermally connected to the adapter plate, wherein the adapter plate serves as a heat dissipation structure for the metal shield such that heat emanating from the plasma to be generated in the interior cavity is conducted through the metal shield to the adapter plate and away from the window.

16. A plasma etching apparatus as recited in claim 15, wherein the metal shield is capable of conducting a flow of electrical current, the metal shield having a plurality of slits, the plurality of slits being configured to control the flow of electrical current.

17. A plasma etching apparatus as recited in claim 15, wherein the metal shield is configured to be integral with the adapter plate.

18. A plasma etching apparatus as recited in claim 15, wherein the metal shield is configured to have a surrounding ring member, the surrounding ring member being configured to mate with a complementary channel present in the adapter plate, the metal shield further configured to be insertable and removable from the adapter plate.

19. A plasma etching apparatus as recited in claim 15, wherein the metal shield is configured to be electrically isolated from the adapter plate, the metal shield being further configured to maintain an electrical charge.

20. A plasma etching apparatus as recited in claim 15, wherein the metal shield is configured to have a surrounding support body, the surrounding support body having a contour configured to mate with a complementary contour present in the adapter plate, the metal shield further configured to be insertable and removable from the lower surface of the adapter plate.

21. A plasma etching apparatus as recited in claim 20, wherein the adapter plate is configured to be removable from the chamber and metal shield.

22. A plasma etching apparatus as recited in claim 15, wherein the metal shield is configured to have a surrounding support body, the surrounding support body having a contour configured to mate with a complementary contour present in the adapter plate, the metal shield further configured to be insertable and removable from the upper surface of the adapter plate.

23. A plasma etching apparatus as recited in claim 15, further comprising an adapter plate liner, the adapter plate liner disposed adjacent to the lower surface of the adapter plate, the metal shield being configured to be integral with the adapter plate liner.

24. A plasma etching apparatus as recited in claim 15, wherein the window is composed of a quartz material.

25. A plasma etching apparatus as recited in claim 15, wherein the window is composed of a ceramic material.

26. A plasma etching apparatus as recited in claim 15, wherein the metal shield is configured to be coated.

27. A plasma etching apparatus as recited in claim 15, wherein the metal shield is configured to have a thickness, the thickness ranging from about 0.03 inch to about 1 inch.

28. A plasma etching apparatus as recited in claim 15, wherein a separation distance between the metal shield and the window ranges from about 0.005 inch to about 0.04 inch.

* * * * *